(12) United States Patent
He et al.

(10) Patent No.: US 10,999,573 B2
(45) Date of Patent: May 4, 2021

(54) PARTIAL LIGHT FIELD DISPLAY ARCHITECTURE

(71) Applicant: Raxium, Inc., Fremont, CA (US)

(72) Inventors: Gang He, Cupertino, CA (US); Richard Peter Schneider, Jr., Sunnyvale, CA (US); Andrew Victor Jones, San Jose, CA (US); James Richard Dodd, Jr., Palo Alto, CA (US); Joseph Hsiao-Tien Han, Redwood City, CA (US)

(73) Assignee: Raxium, Inc., Fremont, CA (US)

( * ) Notice: Subject to any disclaimer, the term of this patent is extended or adjusted under 35 U.S.C. 154(b) by 0 days.

(21) Appl. No.: 16/391,987

(22) Filed: Apr. 23, 2019

(65) Prior Publication Data
US 2019/0335165 A1    Oct. 31, 2019

Related U.S. Application Data

(60) Provisional application No. 62/662,633, filed on Apr. 25, 2018.

(51) Int. Cl.
| | |
|---|---|
| *G09G 3/20* | (2006.01) |
| *G09G 3/32* | (2016.01) |
| *H04N 13/356* | (2018.01) |
| *H01L 27/15* | (2006.01) |
| *H01L 33/06* | (2010.01) |
| *H01L 33/32* | (2010.01) |
| *H01L 33/30* | (2010.01) |
| *H04N 13/398* | (2018.01) |
| *G02B 30/26* | (2020.01) |

(52) U.S. Cl.
CPC .......... *H04N 13/356* (2018.05); *G02B 30/26* (2020.01); *G09G 3/2003* (2013.01); *G09G 3/32* (2013.01);
(Continued)

(58) Field of Classification Search
CPC ................. G09G 3/2003; G09G 3/32; G09G 2320/0666; G09G 2320/0626;
(Continued)

(56) References Cited

U.S. PATENT DOCUMENTS

| | | | |
|---|---|---|---|
| 2003/0016444 A1* | 1/2003 | Brown ................. | H04N 13/324 359/462 |
| 2012/0056879 A1* | 3/2012 | Song ...................... | H04N 13/32 345/419 |

(Continued)

OTHER PUBLICATIONS

International Written Opinion and Search Report corresponding to International Application No. PCT/US2019/28921, dated Aug. 22, 2019.

*Primary Examiner* — Md Saiful A Siddiqui
(74) *Attorney, Agent, or Firm* — Lathrop GPM LLP

(57) ABSTRACT

The disclosure describes various aspects of a partial light field display architecture. In an aspect, a light field display includes multiple picture elements (e.g., super-raxels), where each picture element includes a first portion having a first set of light emitting elements, where the first portion is configured to produce light outputs that contribute to at least one a two-dimensional (2D) view. Each picture element also includes a second portion including a second set of light emitting elements (e.g., sub-raxels) configured to produce light outputs (e.g., ray elements) that contribute to at least one three-dimensional (3D) view. The light field display also includes electronic means configured to drive the first set of light emitting elements and the second set of light emitting elements in each picture element. The light field display can also dynamically identify the first portion and the second portion and allocate light emitting elements accordingly.

16 Claims, 18 Drawing Sheets

(52) U.S. Cl.
CPC ............ H01L 27/156 (2013.01); H01L 33/06 (2013.01); H01L 33/30 (2013.01); H01L 33/32 (2013.01); H04N 13/398 (2018.05); *G09G 2320/0626* (2013.01); *G09G 2320/0666* (2013.01)

(58) Field of Classification Search
CPC ......... G09G 2354/00; G09G 2320/028; G09G 2320/068; G09G 2300/0452; G09G 3/003; G09G 2300/0443
See application file for complete search history.

(56) References Cited

U.S. PATENT DOCUMENTS

| | | | | |
|---|---|---|---|---|
| 2012/0194509 A1* | 8/2012 | Yun | ...................... | H04N 13/361 345/419 |
| 2012/0236403 A1* | 9/2012 | Sykora | .................. | G02B 30/27 359/463 |
| 2012/0287139 A1 | 11/2012 | Wyatt | | |
| 2013/0141423 A1* | 6/2013 | Cho | ........................ | G02B 30/24 345/419 |
| 2013/0257827 A1* | 10/2013 | Hsieh | ..................... | G09G 3/342 345/204 |
| 2014/0029094 A1* | 1/2014 | Kroon | .................. | H01L 27/3218 359/463 |
| 2014/0078720 A1* | 3/2014 | An | .................... | G02F 1/133603 362/97.1 |
| 2015/0304623 A1* | 10/2015 | Yoon | .................... | H04N 13/361 345/419 |
| 2016/0234487 A1* | 8/2016 | Kroon | .................. | H04N 13/317 |
| 2016/0238352 A1* | 8/2016 | Baldridge | ................ | F41J 5/041 |
| 2017/0167703 A1* | 6/2017 | Cok | ........................ | H05B 45/10 |
| 2017/0237973 A1* | 8/2017 | Jung | ....................... | H01L 51/524 348/59 |
| 2017/0358604 A1* | 12/2017 | Lee | ......................... | H01L 33/44 |
| 2018/0097033 A1* | 4/2018 | Ahmed | ................ | H01L 27/156 |
| 2020/0033621 A1* | 1/2020 | Fattal | ................... | G02B 6/0068 |

\* cited by examiner

PARTIAL LIGHT FIELD DISPLAY ARCHITECTURE

CROSS REFERENCE TO RELATED APPLICATIONS

The present application claims the priority to and the benefit of U.S. Provisional Patent Application No. 62/662,633, entitled "PARTIAL LIGHT FIELD DISPLAY ARCHITECTURE," and filed on Apr. 25, 2018, the contents of which are incorporated herein by reference in their entirety.

BACKGROUND OF THE DISCLOSURE

Aspects of the present disclosure generally relate to displays, and more specifically, to a partial light field display architecture.

With the advent of different video applications and services, there is a growing interest in the use of displays that can provide an image in three full dimensions (3D). There are different types of displays capable of doing so, including volumetric displays, holographic displays, integral imaging displays, and compressive light field displays, to name a few. Existing display technologies can have several limitations, including limitations on the views provided to the viewer, the complexity of the equipment needed to provide the various views, or the cost associated with making the display.

Light field or lightfield displays, however, present some of the better options as they can be flat displays configured to provide multiple views at different locations to enable the perception of depth or 3D to a viewer. Light field displays can require a large number of light emitting elements, at resolutions that can be two to three orders of magnitude greater than those of traditional displays. Therefore, there are challenges in both the number of light emitting elements and the manner in which they are organized that need consideration to enable the ultra-high-density required to provide the best possible experience to a viewer.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

As used in this disclosure, the term sub-raxel may refer to a light emitting element, including light emitting element that produce a single color of light and light emitting elements that produce red, green, and blue light, the term raxel may refer to a group or allocation of sub-raxels (e.g., neighboring or nearby positioned sub-raxels), and the term super-raxel or picture element may refer to an array or arrangement of light emitting elements that are organized, grouped, or otherwise allocated into different raxels.

In an aspect of the disclosure, a light field display includes multiple picture elements (e.g., super-raxels), where each picture element includes a first portion having a first set of light emitting elements, where the first portion is configured to produce light outputs that contribute to at least one two-dimensional (2D) view provided by the light field display. A picture element may also be referred to as a light field picture element. Each picture element also includes a second portion having a second set of light emitting elements (e.g., sub-raxels) that produce light outputs that contribute to at least one three-dimensional (3D) view provided by the light field display. The light field display also includes electronic means configured to drive the first set of light emitting elements and the second set of light emitting elements in each picture element. The light field display can also dynamically identify the first portion and the second portion and allocate light emitting elements accordingly. Separate groups (e.g., raxels) of light emitting elements can be configured to compose picture elements (e.g., super-raxels) and a directional resolution of the light field display can be based on the number of groups.

BRIEF DESCRIPTION OF THE DRAWINGS

The appended drawings illustrate only some implementation and are therefore not to be considered limiting of scope.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

Figure 1A:
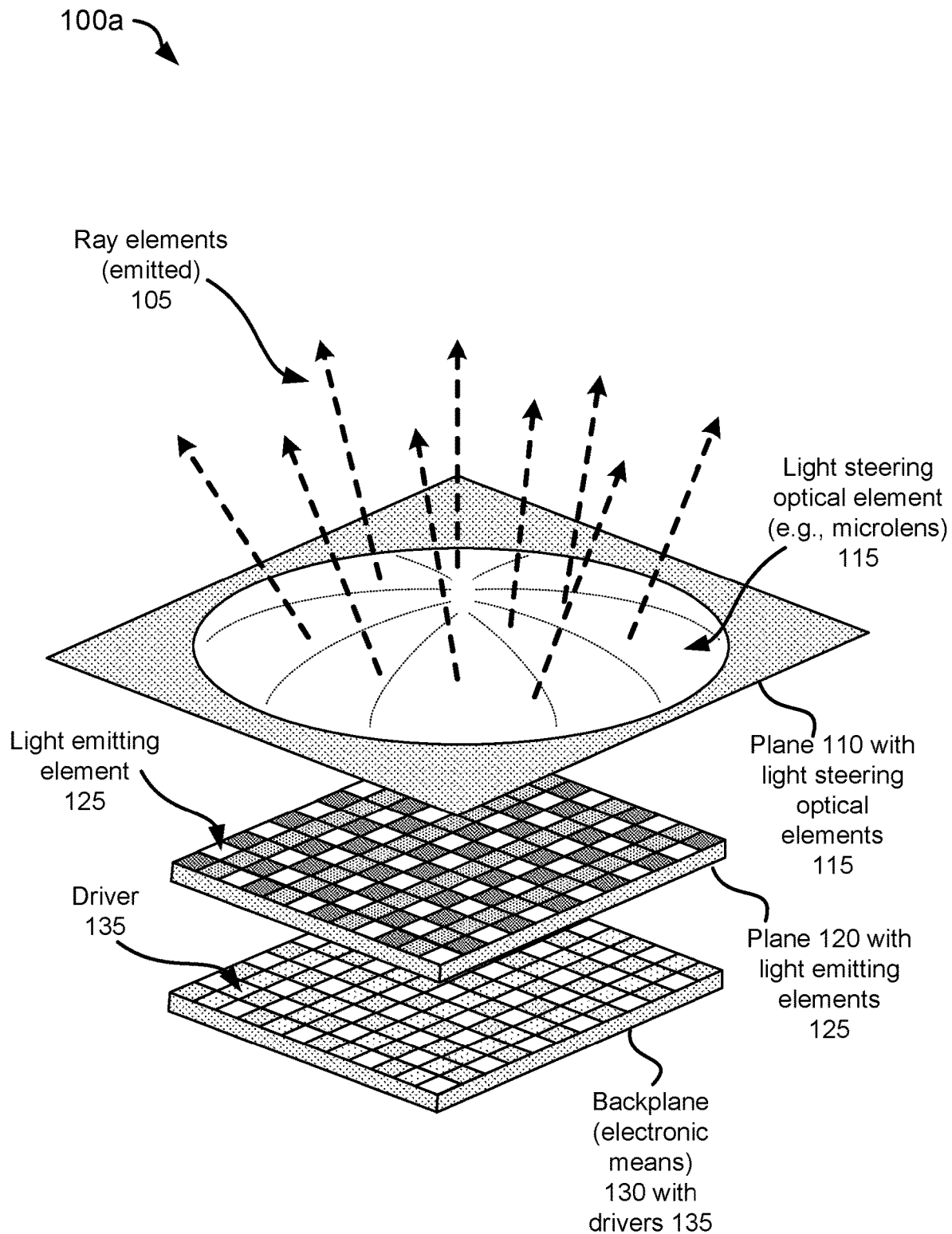
FIG. 1A illustrates an example of a picture element for light field displays, in accordance with aspects of this disclosure.

FIG. 1A shows a diagram 100a describing an example of a picture element for light field displays, also referred to as multi-view displays, for example. A light field display (see e.g., light field displays 310 in FIGS. 3-5) can include multiple picture elements (see e.g., picture elements 320 in FIGS. 3-5), which can be organized in arrays, grids, or other types of ordered arrangements. In some implementations, the multiple picture elements can be monolithically integrated on a same semiconductor substrate. That is, multiple picture elements can be fabricated, constructed, and/or formed from one or more layers of the same or different materials disposed, formed, and/or grown on a single, continuous semiconductor substrate. Additional details regarding materials and other aspects related to the semiconductor substrate are provided below. In this disclosure, the term "picture element" and the term "super-raxel" can be used interchangeably to describe a similar structural unit in a light field display. In some instances, a "picture element" can be referred to as a pixel, but it is different from a pixel used in traditional displays.

A single picture element can include many light emitting elements 125. As noted above, a picture element is different from a pixel in a traditional display in that a pixel generally identifies a discrete element that emits light (e.g., in a non-directional manner, Lambertian emission) while a picture element includes multiple light emitting elements 125, which are themselves organized and configured to produce or generate light outputs that can be directional in nature, where these light outputs (e.g., ray elements) contribute to the formation of multiple, different light field views that are to be provided by the light field display to a viewer in different locations or positions away from the light field display. In an example, each particular location or position away from the light field display can be associated with a light field view provided by the light field display. Additional aspects regarding the arrangement and characteristics of the light emitting elements 125 in a picture element are described in more detail below, further identifying differences between a picture element in a light field display and a pixel in a traditional display.

A picture element can have a corresponding light steering optical element 115 as shown in FIG. 1A. The light steering optical element 115 can be configured to steer or direct different ray elements 105 produced (e.g., emitted) by the light emitting elements 125. In an aspect, the different ray elements 105 may correspond to different directions of light outputs produced by one or more light emitting elements 125. In this regard, the directional resolution of the picture element or the light field display may correspond to a number of light output directions supported. Moreover, the light field views provided by the light field display are produced by a contribution from various light outputs that are received by the viewer in a particular location or position away from the light field display. The light steering optical element 115 can be considered part of the picture element, that is, the light steering optical element 115 is an integral component of the picture element. The light steering optical element 115 can be aligned and physically coupled or bonded to the light emitting elements 125 of its respective picture element. In some implementations, there may be one or more layers or materials (e.g., optically transparent layers or materials) disposed between the light steering optical element 115 and the light emitting elements 125 of its respective picture element.

In one example, a light steering optical element 115 can be a microlens or a lenslet as shown in FIG. 1A, which can be configured to steer or direct the ray elements 105 (e.g., the different light field views) in the appropriate directions. A light steering optical element 115 can include a single optical structure (e.g., a single microlens or lenslet) or can be constructed or formed to include multiple optical structures. For example, a light steering optical element 115 can have at least one microlens, at least one grating, or a combination of both. In another example, a light steering optical element 115 can have multiple layers of optical components (e.g., microlenses and/or gratings) that combined produce the appropriate light steering effect. For example, a light steering optical element 115 can have a first microlens and a second microlens stacked over the first microlens, with the first microlens being associated with a first layer and the second microlens being associated with a second layer. A different example can use a grating or a grating and microlens combination in either or both layers. The construction of the light steering optical element 115, and therefore the positioning and characteristics of any microlenses and/or gratings built or formed therein, is intended to produce the proper steering or directing of the ray elements 105.

Different types of devices can be used for the light emitting elements 125. In one example, a light emitting element 125 can be a light-emitting diode (LED) made from one or more semiconductor materials. The LED can be an inorganic LED. To achieve the high densities needed in light field displays, the LED can be, for example, a micro-LED, also referred to as a microLED, an mLED, or a μLED, which can provide better performance, including brightness and energy efficiency, than other display technologies such as liquid crystal display (LCD) technology or organic LED (OLED) technology. The terms "light emitting element," "light emitter," or "emitter," can be used interchangeably in this disclosure, and can also be used to refer to a microLED. Moreover, any of these terms can be used interchangeably with the term "sub-raxel" to describe a similar structural unit in a light field display.

The light emitting elements 125 of a picture element can be monolithically integrated on a same semiconductor substrate. That is, the light emitting elements 125 can be fabricated, constructed, and/or formed from one or more layers of the same or different materials disposed, formed, and/or grown on a single, continuous semiconductor substrate. The semiconductor substrate can include one or more of GaN, GaAs, $Al_2O_3$, Si, SiC, $Ga_2O_3$, alloys thereof, or derivatives thereof. For their part, the light emitting elements 125 monolithically integrated on the same semiconductor substrate can be made at least partially of one or more of AlN, GaN, InN, AlAs, GaAs, InAs, AlP, GaP, InP, alloys thereof, or derivatives thereof. In some implementations, each of the light emitting elements 125 can include a quantum well active region made from one or more of the materials described above.

The light emitting elements 125 can include different types of light emitting elements or devices to provide light of different colors, which in turn enable the light field display to make visually available to viewers a particular color gamut or range. In an example, the light emitting elements 125 can include a first type of light emitting element that produces green (G) light, a second type of light emitting element that produces red (R) light, and a third type of light emitting element that produces blue (B) light. In another example, the light emitting elements 125 can optionally include a fourth type of light emitting element that produces white (W) light. In another example, a single light emitting element 125 may be configured to produce different colors of light. Moreover, the lights produced by the light emitting elements 125 in a display enable the entire range of colors available on the display, that is, the display's color gamut. The display's color gamut is a function of the wavelength and linewidth of each of the constituent color sources (e.g., red, green, blue color sources).

In one implementation, the different types of colors of light can be achieved by having changing the composition of one or more materials (e.g., semiconductor materials) in the light emitting elements or by using different structures (e.g., quantum dots of different sizes) as part of or in connection with the light emitting elements. For example, when the light emitting elements 125 of a picture element are LEDs, a first set of the LEDs in the picture can be made at least in part of InGaN with a first composition of indium (In), a second set of the LEDs can be made at least in part of InGaN with a second composition of In different from the first composition of In, and a third set of the LEDs can be made at least in part of InGaN with a third composition of In different from the first and second compositions of In.

In another implementation, the different types of colors of light can be achieved by applying different color converters (e.g., color downconverters) to light emitting elements that produce a same or similar color of light. In one implementation, some or all of the light emitting elements 125 can include a respective color conversion media (e.g., color conversion material or combination of materials). For example, each of the light emitting elements 125 in a picture element is configured to produce blue light. A first set of the light emitting elements 125 simply provides the blue light, a second set of the light emitting elements 125 is further configured to downconvert (e.g., using one conversion media) the blue light to produce and provide green light, and a third set of the light emitting elements 125 is also further configured to downconvert (e.g., using another conversion media) the blue light this time to produce and provide red light.

The light emitting elements 125 of a picture element can themselves be organized in arrays, grids, or other types or ordered arrangements just like picture elements can be organized using different arrangements in a light field display.

Additionally, for each picture element there can be one or more drivers 135 for driving or operating the light emitting elements 125. The drivers 135 can be electronic circuits or means that are part of a backplane 130 and electronically coupled to the light emitting elements 125. The drivers 135 can be configured to provide the appropriate signals, voltages, and/or currents in order to drive or operate the light emitting elements 125 (e.g., to select a light emitting element, control settings, control brightness). In some implementations, there can be a one-to-one correspondence in which one driver 135 can be used to drive or operate a respective light emitting element 125. In other implementations, there can be a one-to-many correspondence in which one driver 135 can be used to drive or operate multiple light emitting elements 125. For example, the drivers 135 can be in the form of unit cells that are configured to drive a single light emitting element 125 or multiple light emitting elements 125.

In addition to the backplane 130 that includes the drivers 135, a light field display can also include a plane 120 having the light emitting elements 125. Moreover, a light field display can also include a plane 110 having the light steering optical elements 115. In an implementation, two of more of the plane 110, the plane 120, and the backplane 130 can be integrated or bonded together to form a stacked or three-dimensional (3D) structure. Additional layers, planes, or structures (not shown) can also be part of the stacked or 3D structure to facilitate or configure the connectivity, interoperability, adhesion, and/or distance between the planes. As used in this disclosure, the term "plane" and the term "layer" can be used interchangeably.

Figure 1B:
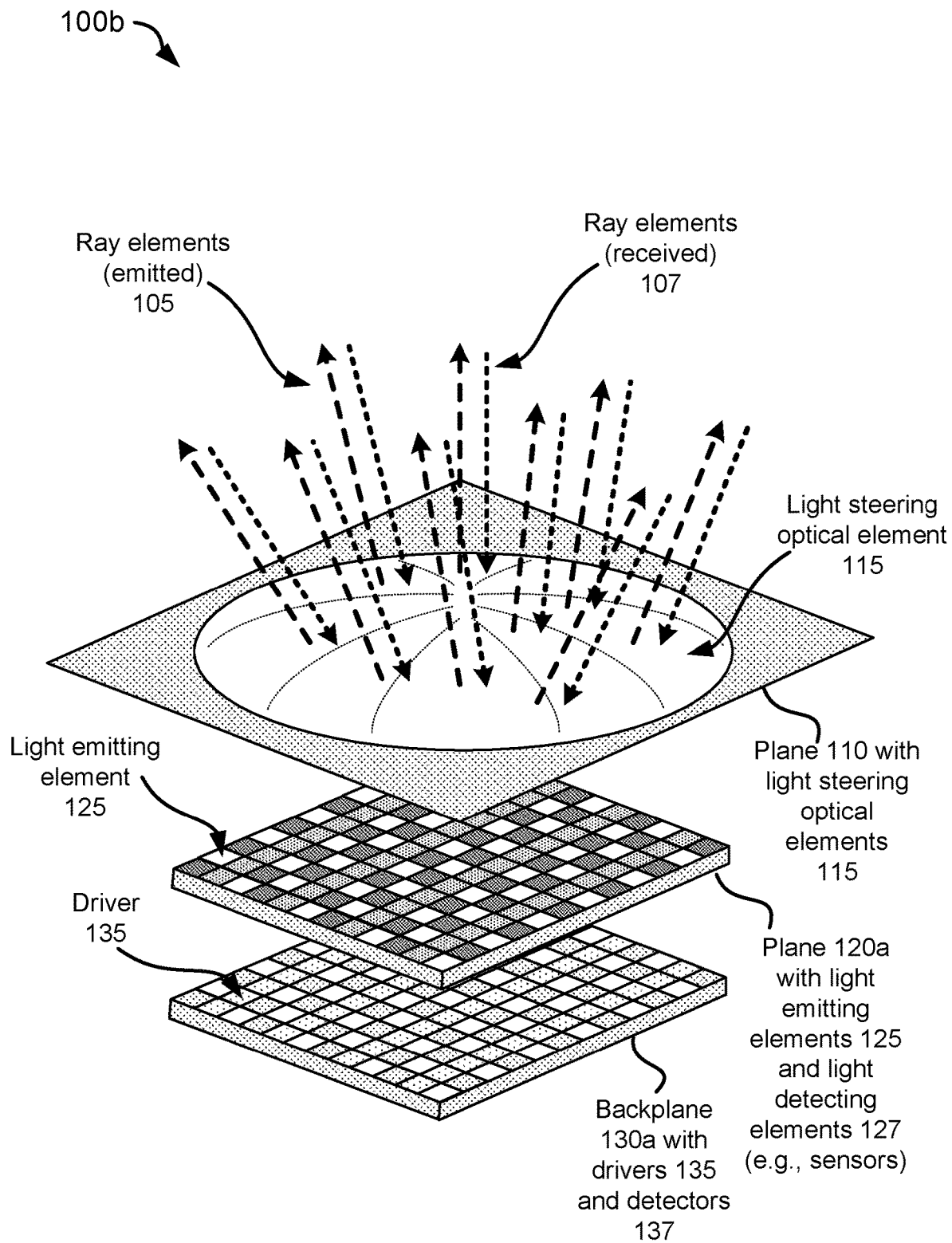
FIG. 1B illustrates another example of a picture element for light field displays, in accordance with aspects of this disclosure.

FIG. 1B shows a diagram 100b illustrating another example of a picture element for light field displays. In this example, the picture element can not only provide or emit ray elements 105 (as shown also in FIG. 1B), but can also be configured to receive ray elements 107 through the light steering optical element 115. The ray elements 107 can correspond to directional light inputs that contribute to various views being received by the picture element or the light field display just like the ray elements 105 can correspond to directional light outputs that contribute to various views being provided by the picture element or the light field display to a viewer.

In the example in FIG. 1B, a plane 120a having the light emitting elements 125 can also include one or more light detecting elements 127 to receive or capture light associated with the ray elements 107. The one or more light detecting elements 127 can be positioned in the plane 120a adjacently surrounded by the light emitting elements 125, or alternatively, the one or more light detecting elements 127 can be positioned in the plane 120a separate from the light emitting elements 125. The terms "light detecting element," "light detector," "light sensor," or "sensor," can be used interchangeably in this disclosure.

In some implementations, the light detecting elements 127 can be monolithically integrated on the same semiconductor substrate as the light emitting elements 125. As such, the light detecting elements 127 can be made of the same types of materials as described above from which the light emitting elements 125 can be made. Alternatively, the light detecting elements 127 can be made of different materials and/or structures (e.g., silicon complimentary metal-oxide-semiconductor (CMOS) or variations thereof) from those used to make the light emitting elements 125.

Moreover, a plane 130a having the drivers 135 can also include one or more detectors 137 electronically coupled to the light detecting elements 127 and configured to provide the appropriate signals, voltages, and/or currents to operate the light detecting elements 127 (e.g., to select a light detecting element, control settings) and to produce signals (e.g., analog or digital signal) representative of the light that is received or captured by the light detecting elements 127.

The construction of the light steering optical element 115 in FIG. 1B, and therefore the positioning and characteristics of any microlenses and/or gratings built therein, is intended to produce the right steering or directing of the ray elements 105 away from the picture element to provide the various contributions that are needed for a viewer to perceive the light field views, and also to produce the right steering or directing of the ray elements 107 towards the appropriate light detecting elements 127. In some implementations, the light detecting elements 127 may use separate or additional light steering optical elements than the light steering optical element 115 used in connection with the light emitting elements 125. In such cases, the light steering optical element for the light detecting elements 127 can be included in the plane 110 having the light steering optical elements 115.

The different picture element structures described in FIGS. 1A and 1B enable control, placement, and directivity of the ray elements produced by the light emitting elements 125 of the picture element. In addition, the picture element structures in FIG. 1B enable control, placement, and directivity of the ray elements received by the picture element.

Figure 2:
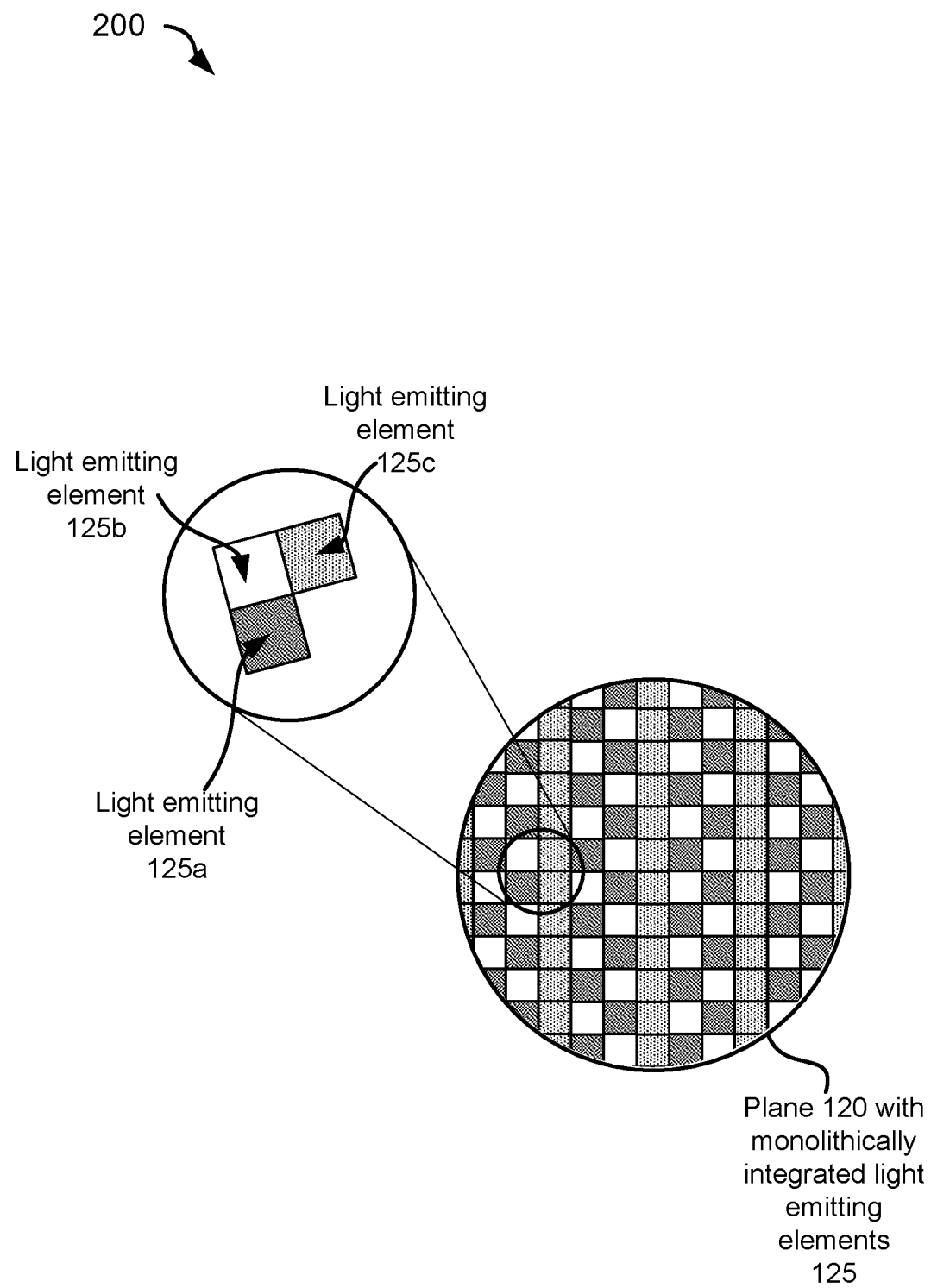
FIG. 2 illustrates an example of light emitting elements in a picture element, in accordance with aspects of this disclosure.

In FIG. 2, a diagram 200 shows an example of a pattern or mosaic of light emitting elements 125 in a picture element. In this example, a portion of an array or grid of light emitting elements 125 that are part of a picture element is enlarged to show one of different patterns or mosaics that can be used for the various types of light emitting elements 125. This example shows three (3) different types of light emitting elements 125, a first type of light emitting element 125a that produces light of one color, a second type of light emitting element 125b that produces light of another color, and a third type of light emitting element 125c that produces light of yet another color. These light colors can be red light, green light, and blue light, for example. In some implementations, the pattern can include twice as many light emitting elements that produce red light than those that produce green light or blue light. In other implementations, the pattern can include a light emitting element that produces red light that is twice a size of those that produce green light or blue light. In other implementations, the pattern can include a fourth type of light emitting element 125 that produces light of fourth color, such as white light, for example. Generally, the area of light emitting elements of one color can be varied relative to the area of light emitting elements of other color(s) to meet particular color gamut and/or power efficiency needs. The patterns and colors described in connection with FIG. 2 are provided by way of illustration and not of limitation. A wide range of patterns and/or colors (e.g., to enable a specified color gamut in the display) may be available for the light emitting elements 125 of a picture element. In another aspect, additional light emitting elements (of any color) can be used in a particular pattern to provide redundancy.

The diagram 200 in FIG. 2 also illustrates having the various types of light emitting elements 125 (e.g., light emitting elements 125a, 125b, and 125c) monolithically integrated on a same semiconductor substrate. For example, when the different types of light emitting elements 125 are based on different materials (or different variations or compositions of the same material), each of these different materials needs to be compatible with the semiconductor substrate such that the different types of light emitting elements 125 can be monolithically integrated with the semiconductor substrate. This allows for the ultra-high-density arrays of light emitting elements 125 (e.g., arrays of RGB light emitting elements) that are needed for light field displays.

Figure 3:
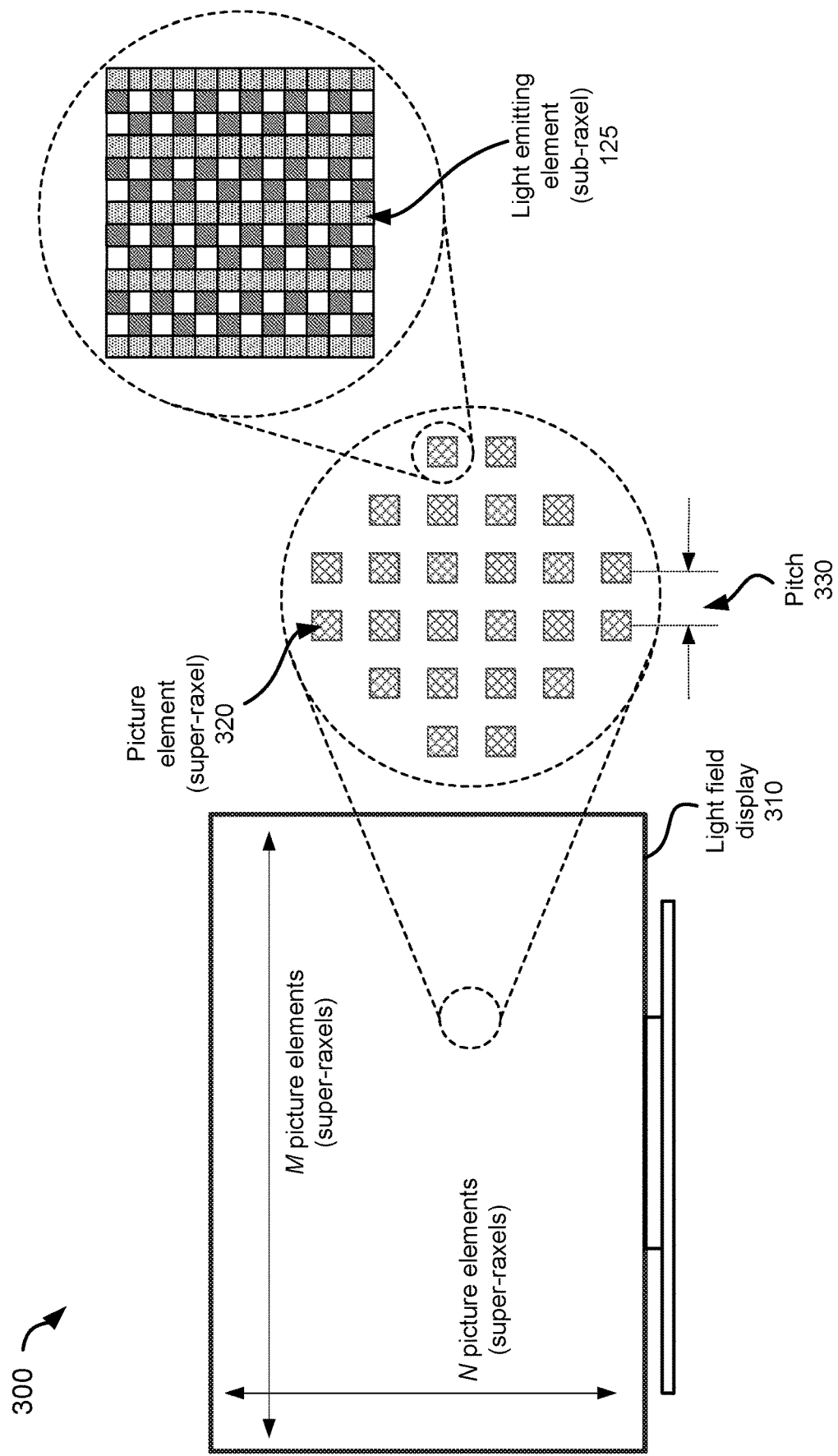
FIG. 3 illustrates an example of a light field display having multiple picture elements, in accordance with aspects of this disclosure.

A diagram 300 in FIG. 3 shows a light field display 310 having multiple picture elements or super-raxels 320. A light field display 310 can be used for different types of applications and its size may vary accordingly. For example, a light field display 310 can have different sizes when used as displays for watches, near-eye applications, phones, tablets, laptops, monitors, televisions, and billboards, to name a few. Accordingly, and depending on the application, the picture elements 320 in the light field display 310 can be organized into arrays, grids, or other types of ordered arrangements of different sizes. In the example shown in FIG. 3, the picture elements 320 can be organized or positioned into an N×M array, with N being the number of rows of picture elements in the array and M being the number of columns of picture elements in the array. An enlarged portion of such an array is shown to the right of the light field display 310. For small displays, examples of array sizes can include N≥10 and M≥10 and N≥100 and M≥100, with each picture element 320 in the array having itself an array or grid of light emitting elements 125. For larger displays, examples of array sizes can include N≥500 and M≥500, N≥1,000 and M≥1,000, N≥5,000 and M≥5,000, and N≥10,000 and M≥10,000, with each picture element 320 in the array having itself an array or grid of light emitting elements 125.

In a more specific example, for a 4K light field display in which the pixels in a traditional display are replaced by the picture elements 320, the N×M array of picture elements 320 can be a 2,160×3,840 array including approximately 8.3 million picture elements 320. Depending on the number of light emitting elements 125 in each of the picture elements 320, the 4K light field display can have a resolution that is one or two orders of magnitude greater than that of a corresponding traditional display. When the picture elements or super-raxels 320 include as light emitting elements 125 different LEDs that produce red (R) light, green (G) light, and blue (B) light, the 4K light field display can be said to be made from monolithically integrated RGB LED super-raxels.

Each of the picture elements 320 in the light field display 310, including its corresponding light steering optical element 115 (e.g., an integral imaging lens), can represent a minimum picture element size limited by display resolution. In this regard, an array or grid of light emitting elements 125 of a picture element 320 can be smaller than the corresponding light steering optical element 115 for that picture element. In practice, however, it is possible for the size of the array or grid of light emitting elements 125 of a picture element 320 to be similar to the size of the corresponding light steering optical element 115 (e.g., the diameter of a microlens or lenslet), which in turn is similar or the same as a pitch 330 between picture elements 320.

An enlarged view of an array of light emitting elements 125 for a picture element 320 is shown to the right of the diagram 300. The array of light emitting elements 125 can be a P×Q array, with P being the number of rows of light emitting elements 125 in the array and Q being the number of columns of light emitting elements 125 in the array. Examples of array sizes can include P≥5 and Q≥5, P≥8 and Q≥8, P≥9 and Q≥9, P≥10 and Q≥10, P≥12 and Q≥12, P≥20 and Q≥20, and P≥25 and Q≥25. In an example, a P×Q array is a 9×9 array including 81 light emitting elements or sub-raxels 125. The array of light emitting elements 125 for the picture element 320 need not be limited to square or rectangular shapes and can be based on a hexagonal shape or other shapes as well.

For each picture element 320, the light emitting elements 125 in the array can include separate and distinct groups of light emitting elements 125 (see e.g., group of light emitting elements 610 in FIGS. 6A, 6B and 8A) that are allocated or grouped (e.g., logically grouped) based on spatial and angular proximity and that are configured to produce the different light outputs (e.g., directional light outputs) that contribute to produce light field views provided by the light field display 310 to a viewer. The grouping of sub-raxels or light emitting elements into raxels need not be unique. For example, during assembly or manufacturing, there can be a mapping of sub-raxels into particular raxels that best optimize the display experience. A similar re-mapping can be performed by the display once deployed to account for, for example, aging of various parts or elements of the display, including variations in the aging of light emitting elements of different colors and/or in the aging of light steering optical elements. In this disclosure, the term "groups of light emitting elements" and the term "raxel" can be used interchangeably to describe a similar structural unit in a light field display. The light field views produced by the contribution of the various groups of light emitting elements or raxels can be perceived by a viewer as continuous or non-continuous views.

Each of the groups of light emitting elements 125 in the array of light emitting elements 125 includes light emitting elements that produce at least three different colors of light (e.g., red light, green light, blue light, and perhaps also white light). In one example, each of these groups or raxels includes at least one light emitting element 125 that produces red light, one light emitting element 125 that produces green light, and one light emitting element 125 that produce blue light. In another example, each of these groups or raxels includes two light emitting elements 125 that produce red light, one light emitting element 125 that produces green light, and one light emitting element 125 that produces blue light. In yet another example, each of these groups or raxels includes one light emitting element 125 that produces red light, one light emitting element 125 that produces green light, one light emitting element 125 that produces blue light, and one light emitting element 125 that produces white light.

Because of the various applications (e.g., different sized light field displays) descried above, the sizes or dimensions of some of the structural units described in connection with the light field display 310 can vary significantly. For example, a size of an array or grid of light emitting elements 125 (e.g., a diameter, width, or span of the array or grid) in a picture element 320 can range between about 10 microns and about 1,000 microns. That is, a size associated with a picture element or super-raxel 320 can be in this range. The term "about" as used in this disclosure indicates a nominal value or a variation within 1%, 2%, 3%, 4%, 5%, 10%, 15%, 20%, or 25% from the nominal value.

In another example, a size of each group of light emitting elements 125 (e.g., a diameter, width, or span of the group) in a picture element 320 can range between about 1 micron and about 10 microns. That is, a size associated with a group of light emitting elements 125 (e.g., raxel 610) can be in this range.

In another example, a size of a group of light emitting elements 125 in a picture element 320 can be greater than 10 microns because a size of the light emitting elements 125 in such a group could be as large as 10 microns.

In yet another example, a size of each light emitting element 125 (e.g., a diameter, width, or span of the light emitting element or sub-raxel) can range between about 0.4 microns and about 4 microns. Similarly, a size of each light emitting element 125 (e.g., a diameter, width, or span of the light emitting element or sub-raxel) can be less than about 1 micron. Moreover, a size of each light emitting element 125 in some implementations can be as large as 10 microns. That is, a size associated with a light emitting element or sub-raxel 125 can be in the ranges described above.

In yet another example, a size of a light steering optical element 115 (e.g., a diameter, width, or span of a microlens or lenslet) can range between about 10 microns and about 1,000 microns, which is similar to the range of sizes for a picture element or super-raxel.

Figure 4:
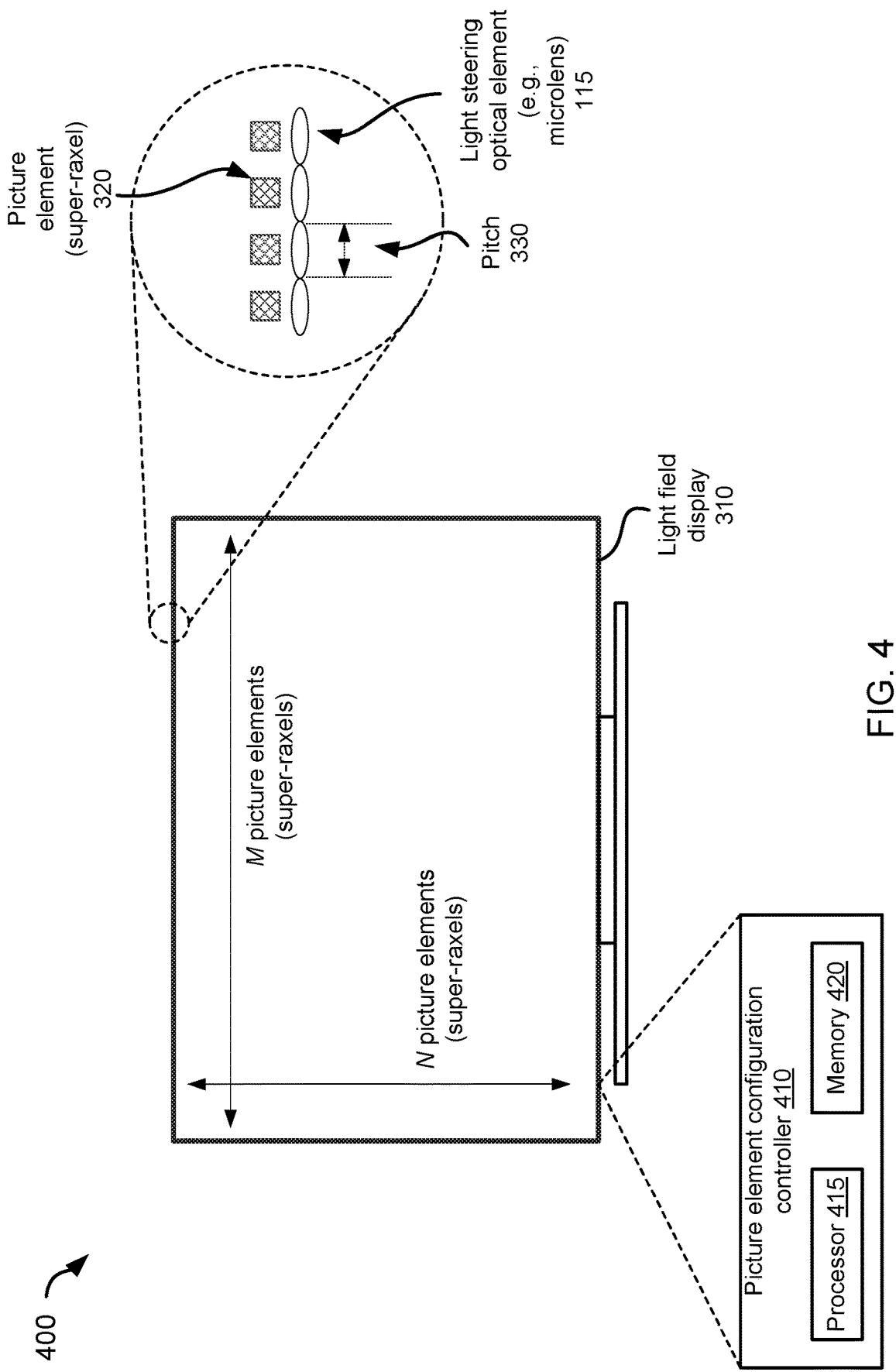
FIG. 4 illustrates another example of a light field display having multiple picture elements, in accordance with aspects of this disclosure.

In FIG. 4, a diagram 400 shows another example of the light field display 310 illustrating an enlarged view of a portion of an array of picture elements 320 with corresponding light steering optical elements 115. The pitch 330 can represent a spacing or distance between picture elements 320 and can be about a size of the light steering optical element 115 (e.g., size of a microlens or lenslet).

In this example, the light field display 310 in FIG. 4 can be a 4K light field display with a 2,160×3,840 array of picture elements or super-raxels 320. In such a case, for a viewer distance of about 1.5 meters or about 5 feet, a size of the light steering optical element 115 can be about 0.5 millimeters. Such a size can be consistent with human acuity of about 1 arc-minute/picture element. The viewer's field of view (FOV) in this example can be about 64 degrees, which can be less than a viewing angle provided by the picture element (e.g., viewing angle>FOV). Moreover, the multiple views provided by the 4K light field display in this example can have a 4 millimeter width, consistent with a diameter of the human pupil. This can translate to the light steering optical element 115 steering the output light produced by a picture element 320 having, for example, $31^2$ light emitting elements 125. Accordingly, the 4K light field display in this example can provide continuous parallax with light field phase or horizontal parallax with light field phase.

The light field display 310 can optionally include a picture element configuration controller 410 that can select, identify, or otherwise choose a configuration that is to be used for the picture elements 320 in the light field display 310. For example, there can be different types of configurations associated with whether a picture element is to support the generation of light outputs that contribute to produce 2D views, 3D views, or a combination of 2D views and 3D views. The picture element configuration controller 410 can identify a particular configuration and can use hardware, software, or a combination of hardware and software to take the light emitting elements of the picture element 320 and organize them into different portions or regions that support the particular configuration of interest. FIGS. 9A-9F, which are described in more detail below, provide some illustrative examples of different configurations that can be programmed or configured into the picture elements 320.

Accordingly, the picture element configuration controller 410 can dynamically identify a first portion (e.g., to produce 2D views) and a second portion (e.g., to produce 3D views) of each picture element 320 as in the various configurations described below in connection with FIGS. 9A-9F. The picture element configuration controller 410 can then, based on the identified first portion and second portion, configure a first set of light emitting elements 125 in the picture element 320 and associated with the first portion, and a second set of light emitting elements 125 in the picture element 320 and associated with the second portion.

Each of the configurations supported includes a corresponding first portion and second portion. As such, when identifying the first portion and the second portion as described above, the first portion is identified from a set of several possible first portions based on several possible configurations, and the second portion is similarly identified from a set of several possible second portions based on several possible configurations.

The picture element configuration controller 410 can include a memory 420 with instructions and a processor 415 configured to execute the instructions to perform the dynamic identification and configuration described above. The picture element configuration controller 410, via the processor 415 and/or the memory 420, can configure one or both of hardware means or software means to perform the dynamic identification and configuration. For example, the picture element configuration controller 410 can configure and/or control the drivers 135 (or unit cells used for driving) in the backplane 130, any software/firmware that controls the drivers 135, and/or hardware/software (not shown) that provides information to the drivers 135 in order to perform the dynamic identification and configuration described above. By doing so, it is possible for the picture element configuration controller 410 to identify, select, and configure a first set of light emitting elements 125 in a picture element 320 to be part of the first portion of the picture element 320 and a second set of light emitting elements 125 in a picture element 320 to be part of the second portion of the picture element 320.

Figure 5:
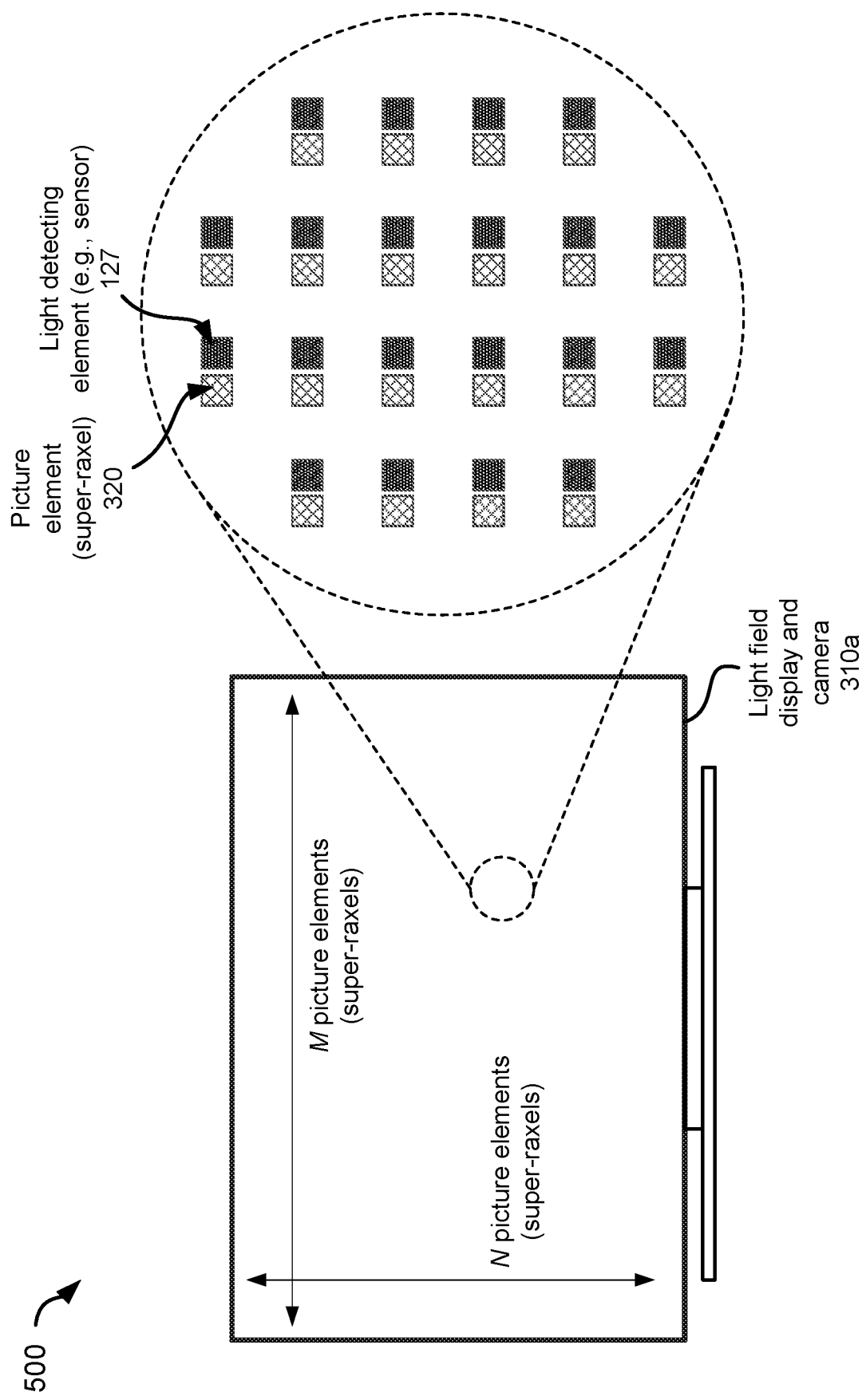
FIG. 5 illustrates an example of a light field display and camera having multiple picture elements and light detecting elements, in accordance with aspects of this disclosure.

A diagram 500 in FIG. 5 illustrates an alternative configuration of a light field display that is also capable of operating as a camera by performing light field capture using neighboring light detecting elements or sensors 127. In this example, a light field display and camera 310*a* includes an N×M array of picture elements 320, a portion of the array is shown enlarged to the right of the diagram 500. The light detecting elements 127 can be, for example, silicon-based image sensors assembled with similar integral optical elements as those used by the picture elements 320 (e.g., the light steering optical elements 115). In one implementation, as shown in FIG. 5, the light detecting elements 127 can be positioned nearby or adjacent to the picture elements 320 in a one-to-one correspondence (e.g., one capture element for each display element). In other implementations, the number of light detecting elements 127 can be less than the number of picture elements 320.

In an example, each light detecting element 127 can include multiple sub-sensors for capturing light in the same fashion as each picture element 320 (e.g., a super-raxel) can include multiple light emitting elements 125 (e.g., multiple sub-raxels) or multiple groups of light emitting elements 125 (e.g., multiple raxels).

As described above in connection with FIG. 1B, the light detecting elements 127 can be integrated in the same plane 120*a* as the light emitting elements 125. Some or all of the features of the light detecting elements 127, however, could be implemented in the backplane 130*a* since the backplane 130*a* is also likely to be silicon-based (e.g., a silicon-based substrate). In such a case, at least some of the features of the light detecting elements 127 can be integrated with the detectors 137 in the backplane 130*a* to more efficiently have the circuitry or electronic means in the detectors 137 operate the light detecting elements 127.

Figure 6A:
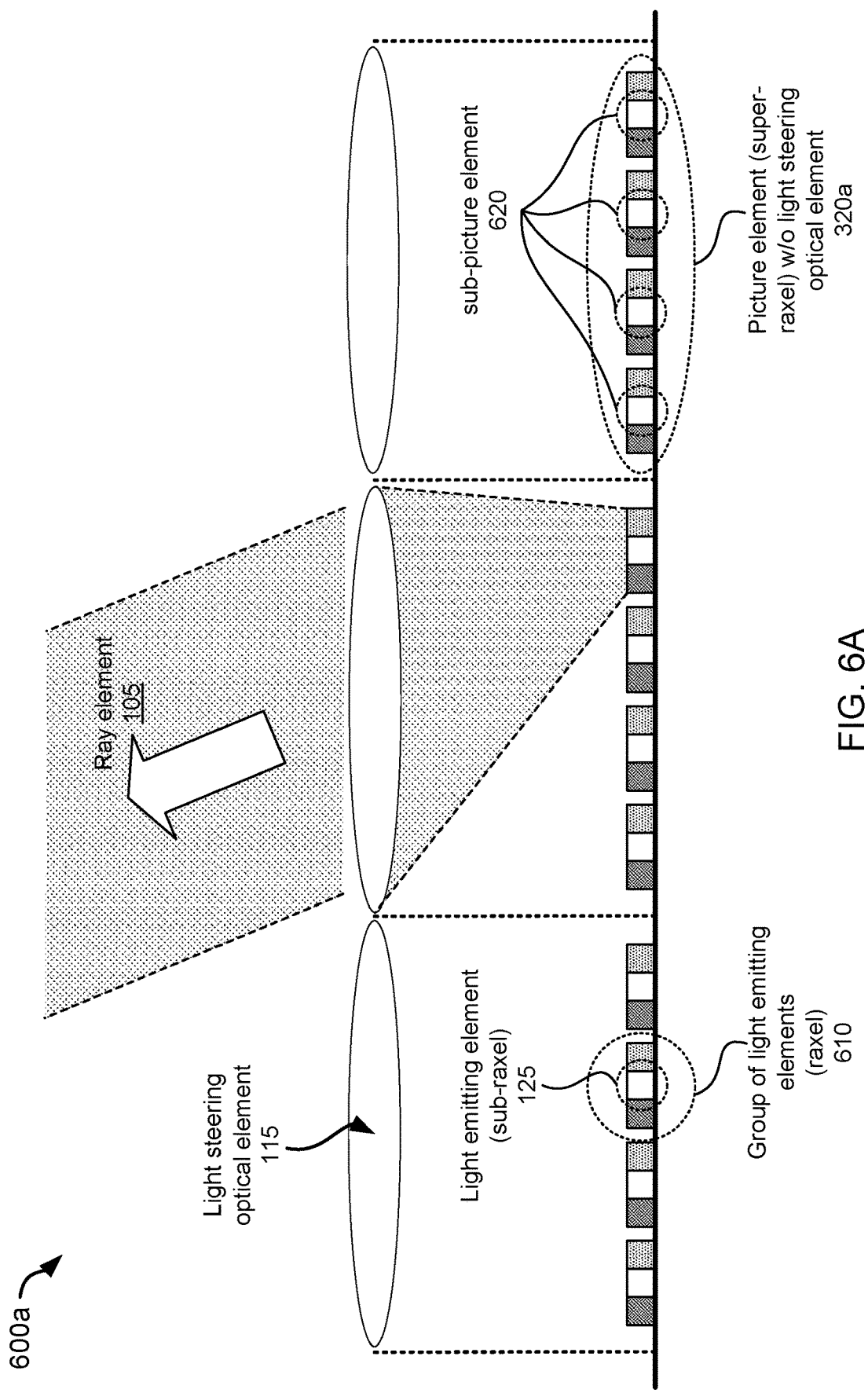
FIG. 6A illustrates an example of a cross-sectional view of a portion of a light field display, in accordance with aspects of this disclosure.

A diagram 600*a* in FIG. 6A shows a cross-sectional view of a portion of a light field display (e.g., the light field display 310) to illustrate some of the structural units described in this disclosure. For example, the diagram 600*a* shows three adjacent picture elements or super-raxels 320*a*, each having a corresponding light steering optical element 115. In this example, the light steering optical element 115 can be considered separate from the picture element 320*a* but in other instances the light steering optical element 115 can be considered to be part of the picture element.

As shown in FIG. 6A, each picture element 320*a* includes multiple light emitting elements 125 (e.g., multiple sub-raxels), where several light emitting elements 125 (e.g., several sub-raxels) of different types can be grouped together into the group 610 (e.g., into a raxel) associated with a particular light view to be provided by the light field display. A group or raxel can produce various components (see FIG. 6B) that contribute to a particular ray element 105 as shown by the right-most group or raxel in the middle picture element 320*a*. Is it to be understood that the ray elements 105 produced by different groups or raxels in different picture elements can contribute to a view perceived by viewer away from the light field display.

An additional structural unit described in FIG. 6A is the concept of a sub-picture element 620, which represents a grouping of the light emitting elements 125 of the same type (e.g., produce the same color of light) of the picture element 320*a*. Additional details related to sub-picture elements 620 are described below in connection with FIGS. 8B, 9B, and 9C.

Figure 6B:
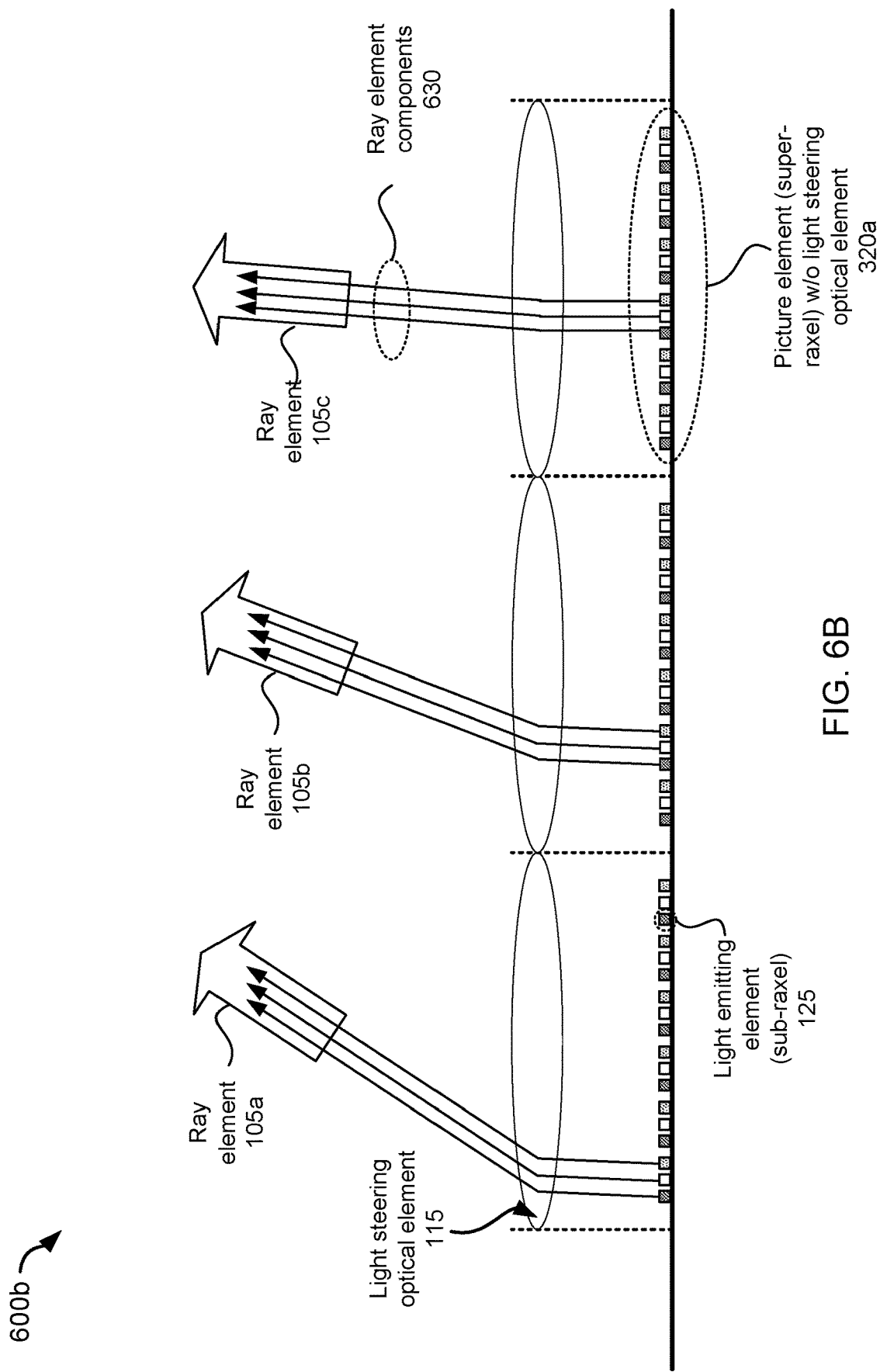
FIG. 6B illustrates another example of a cross-sectional view of a portion of a light field display, in accordance with aspects of this disclosure.

A diagram 600*b* in FIG. 6B shows another cross-sectional view of a portion of a light field display (e.g., the light field display 310) to illustrate the varying spatial directionality of the ray elements produced by three adjacent picture elements or super-raxels 320*a*, each having a corresponding light steering optical element 115. In this example, a group of light emitting elements 125 in the left-most picture element 320*a* produces a ray element 105*a* (e.g., light output), where the ray element 105*a* is a combination of ray element components 630 (e.g., light output sub-components) produced or generated by the group of light emitting elements 125. For example, when the group of light emitting elements 125 includes three light emitting elements 125, each of these can produce or generate a component (e.g., a light component of a different color) of the ray element 105*a*. The ray element 105*a* has a certain, specified spatial directionality, which can be defined based on multiple angles (e.g., based on two or three angles).

Similarly, a group of light emitting elements 125 in the middle picture element 320*a* produces a ray element 105*b* (e.g., light output), where the ray element 105*b* is a combination of ray element components 630 produced or generated by the group of light emitting elements 125. The ray element 105*b* has a certain, specified spatial directionality, different from the one of the ray element 105*a*, which can also be defined based on multiple angles. The same applies for the ray element 105*c* produced by a group of light emitting elements 125 in the right-most picture element 320*a*.

Figure 7A:
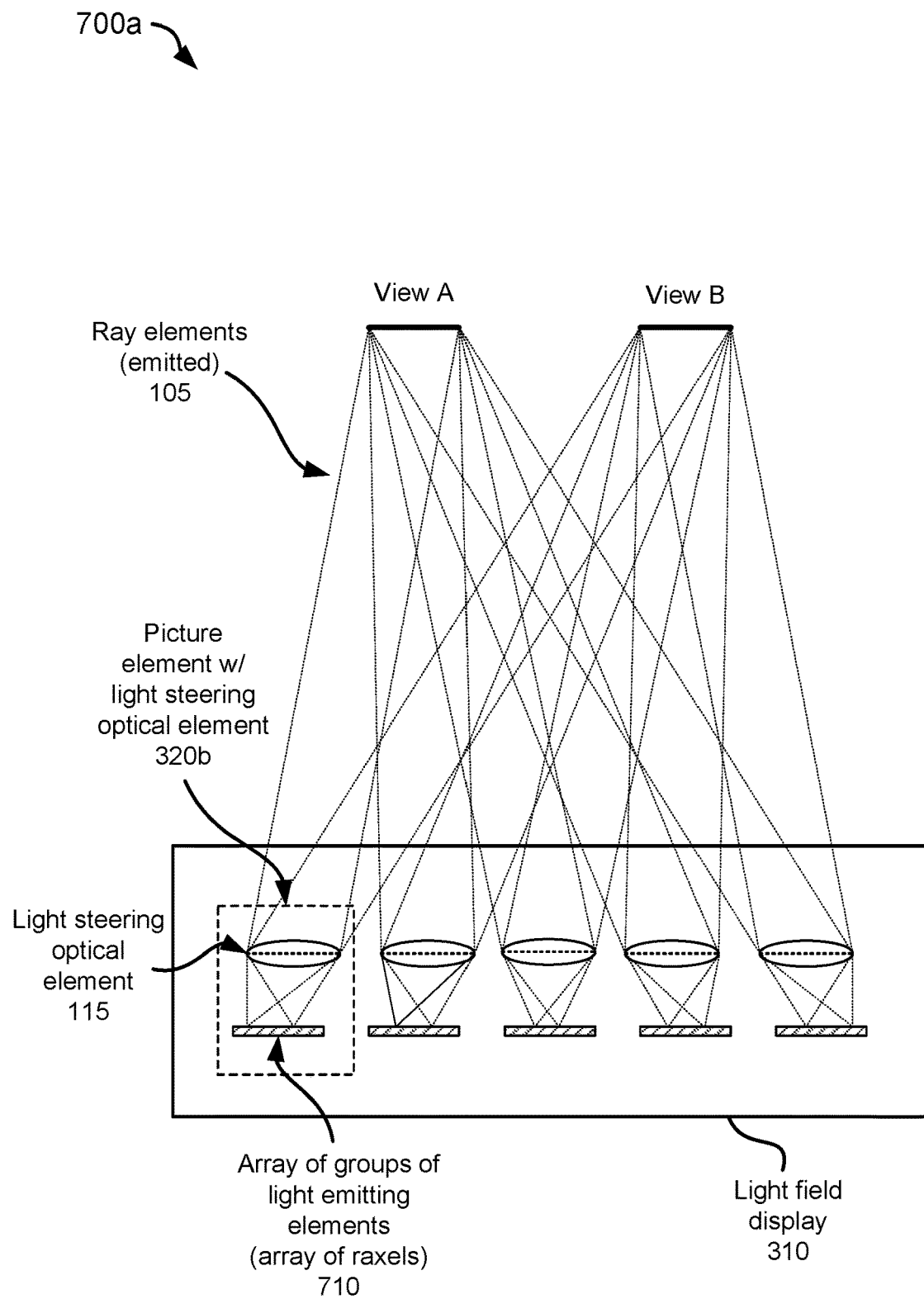
FIG. 7A illustrates an example of a configuration of a light field display, in accordance with aspects of this disclosure.

The following figures describe different configurations for a light field display (e.g., the light field display 310). In FIG. 7A, a diagram 700*a* shows a first configuration or approach for a light field display. In this configuration, which can be referred to as a picture element array of raxel arrays different light field views (e.g., View A, View B) can be provided by combining the ray elements 105 emitted by the various picture elements 320*b* in the light field display 310. In this example, the light steering optical element 115 can be considered to be part of the picture elements 320*b*. For each picture element 320b, there is an array or grid 710 of groups of light emitting elements 125 (e.g., an array or grid of raxels), where each of these groups produces a light output having at least one component (see FIG. 6B) that is provided by the light field display 310 as a contribution to construct or form a view perceived by a viewer at a certain location or position from the light field display 310. For example, in each of the picture elements 320b, there is at least one group or raxel in the array 710 that contributes to View A and there is at least another group or raxel in the array 710 that contributes to View B. In some instances, depending on the location or position of the viewer relative to the light field display 310, the same group or raxel can contribute to both View A and View B.

In an aspect of the light field display 310 in FIG. 7A, for each picture element 320b, there can be a spatial (e.g., lateral) offset between a position of the light steering optical element 115 and a position of the array 710 based on where the picture element 320b is positioned in the light field display 310.

Figure 7B:
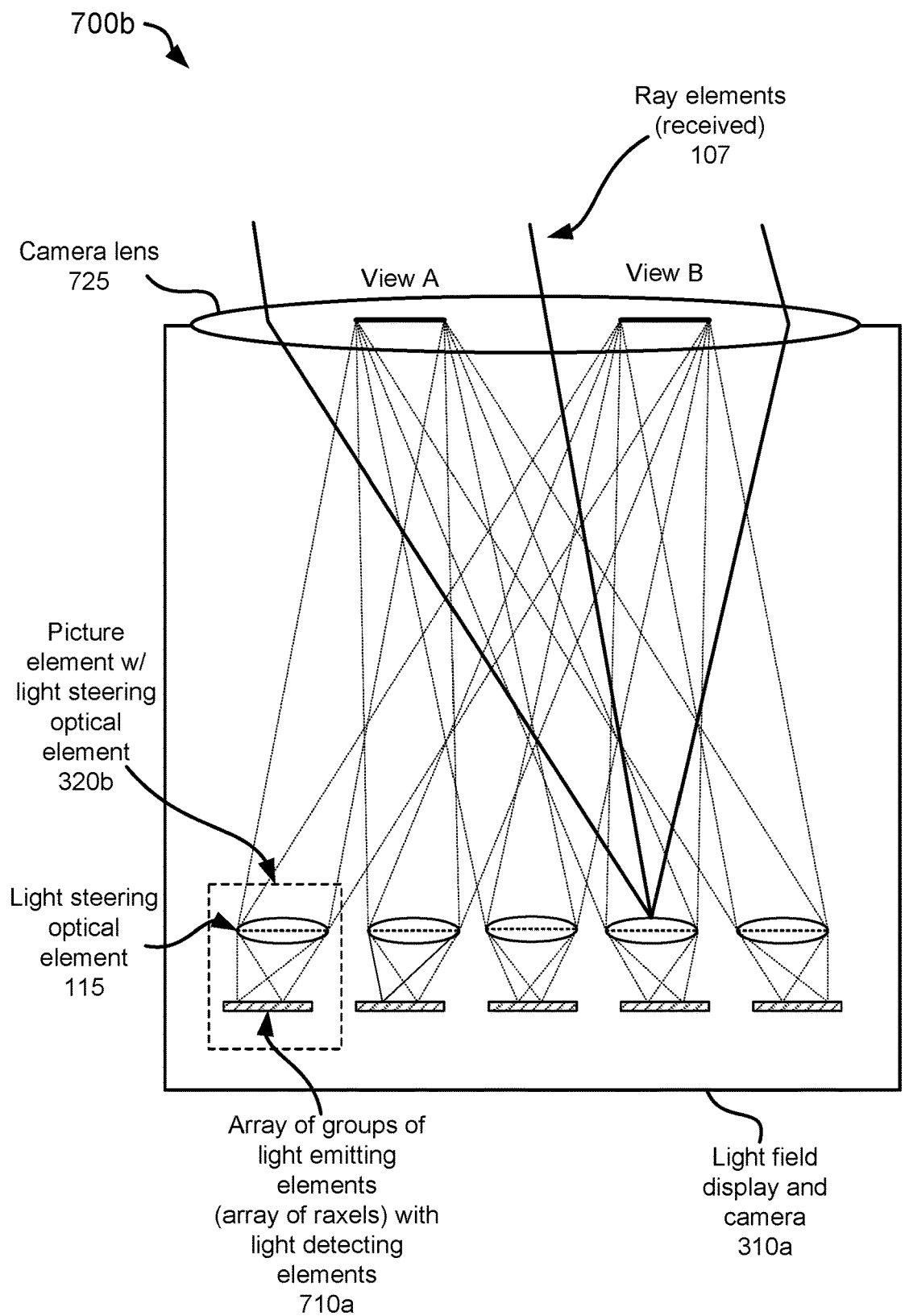
FIG. 7B illustrates another example of a configuration of a light field display, in accordance with aspects of this disclosure.

In FIG. 7B, a diagram 700b shows a second configuration or approach for a light field display that supports light capture as well. The light field display and camera 310a in this configuration is substantially similar to the light field display 310 shown in FIG. 7A, however, in the light field display and camera 310a there is a camera lens 725 to steer or direct the ray elements 107 to the appropriate light detecting elements (e.g., sensors 127) in an array 710a having groups of light emitting elements 125 along with the light detecting elements.

Figure 8A:
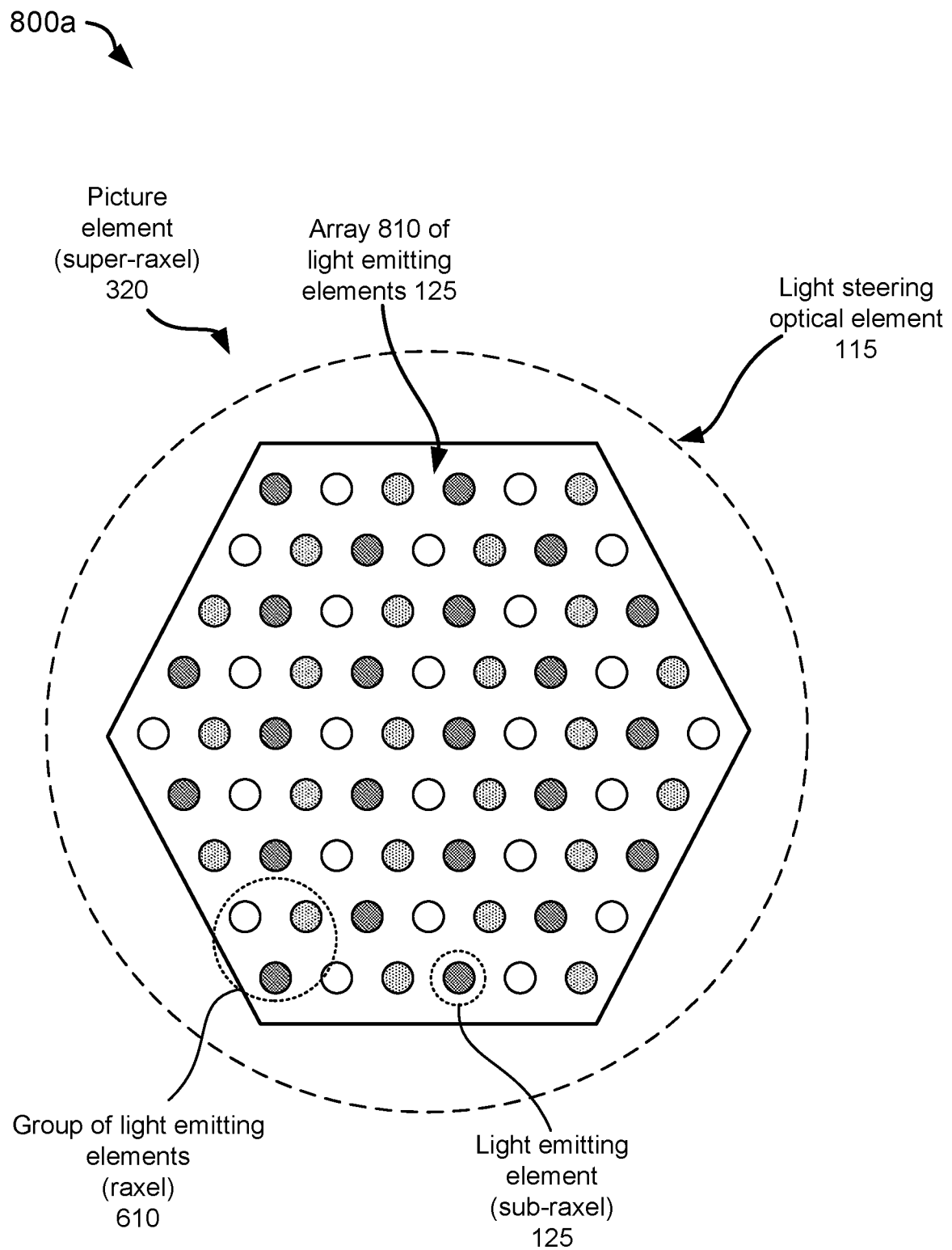
FIG. 8A illustrates an example of an array of light emitting elements in a picture element, in accordance with aspects of this disclosure.

FIG. 8A shows a diagram 800a describing various details of one implementation of a picture element 320. For example, the picture element 320 (e.g., a super-raxel) has a respective light steering optical element 115 (shown with a dashed line) and includes an array or grid 810 of light emitting elements 125 (e.g., sub-raxels) monolithically integrated on a same semiconductor substrate. The light steering optical element 115 can be of the same or similar size as the array 810, or could be slightly larger than the array 810 as illustrated. It is to be understood that some of the sizes illustrated in the figures of this disclosure have been exaggerated for purposes of illustration and need not be considered to be an exact representation of actual or relative sizes.

The light emitting elements 125 in the array 810 include different types of light emitting elements to produce light of different colors and are arranged or configured (e.g., via hardware and/or software) into separate groups 610 (e.g., separate raxels), each of which produces a different light output (e.g., directional light output) that contributes to one or more light field views perceived by a viewer. That is, each group 610 is configured to contribute to one or more of the views that are to be provided to a viewer (or viewers) by the light field display that includes the picture element 320.

As shown in FIG. 8A, the array 810 has a geometric arrangement to allow adjacent or close placement of two or more picture elements. The geometric arrangement can be one of a hexagonal shape (as shown in FIG. 8A), a square shape, or a rectangular shape.

Although not shown, the picture element 320 in FIG. 8A can have corresponding electronic means (e.g., in the backplane 130 in FIG. 1A) that includes multiple driver circuits configured to drive the light emitting elements 125 in the picture element 230. In the example in FIG. 8A, the electronic means can include multiple unit cells configured to control the operation of individual groups and/or light emitting elements that are part of a group.

Figure 8B:
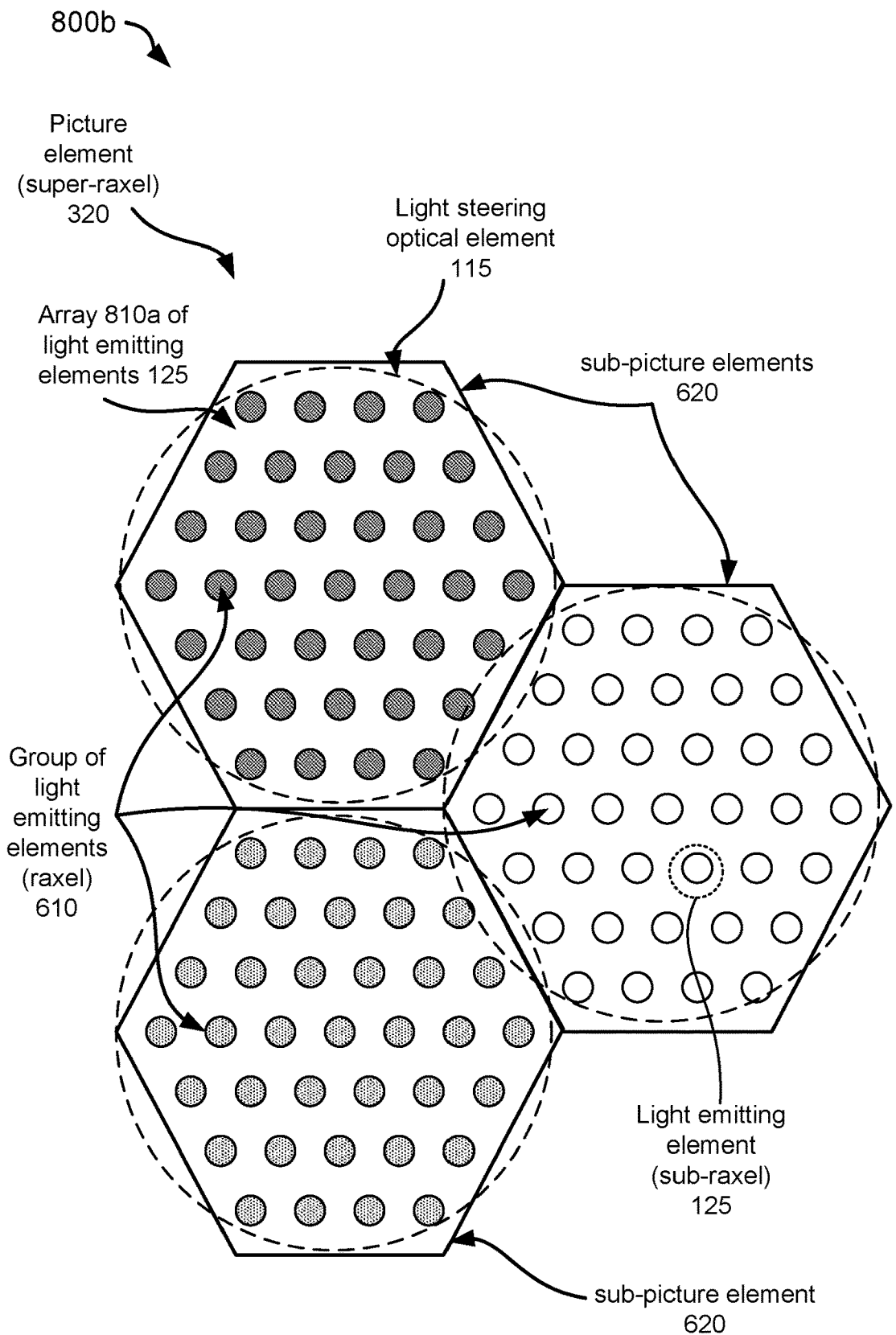
FIG. 8B illustrates an example of a picture element with sub-picture elements, in accordance with aspects of this disclosure.

FIG. 8B shows a diagram 800b describing various details of another implementation of a picture element 320. For example, the picture element 320 (e.g., a super-raxel) in FIG. 8B includes multiple sub-picture elements 620 monolithically integrated on a same semiconductor substrate. Each sub-picture element 620 has a respective light steering optical element 115 (shown with a dashed line) and includes an array or grid 810a of light emitting elements 125 (e.g., sub-raxels) that produce the same color of light. The light steering optical element 115 can be of the same or similar size as the array 810a, or could be slightly larger than the array 810a as illustrated. For the picture element 320, the light steering optical element 115 of one of the sub-picture elements 620 is configured to minimize the chromatic aberration for a color of light produced by the light emitting elements 125 in that sub-picture element 620 by optimizing the structure of the light steering optical element for the specified color wavelength. By minimizing the chromatic aberration it may be possible to improve the sharpness of the light field views and compensate for how the magnification is different away from the center of the picture element. Moreover, the light steering optical element 115 is aligned and bonded to the array 810a of the respective sub-picture element 620.

The light emitting elements 125 of the sub-picture elements 620 are arranged into separate groups 610 (e.g., raxels). Each group 610 can provide a contribution (e.g., a ray element) to a view perceived by a viewer at a certain position or location from the light field display. In one example, each group 610 can include collocated light emitting elements 125 from each of the sub-picture elements 620 (e.g., same position in each sub-picture element). In another example, each group 610 can include non-collocated light emitting elements 125 from each of the sub-picture elements 620 (e.g., different positions in each sub-picture element). In yet another example, each group 610 can include a combination of collocated and non-collocated light emitting elements 125 from each of the sub-picture elements 620.

As shown in FIG. 8B, the array 810a has a geometric arrangement to allow adjacent placement of two or more sub-picture elements. The geometric arrangement can be one of a hexagonal shape (as shown in FIG. 8B), a square shape, or a rectangular shape.

Although not shown, the picture element 320 in FIG. 8B can have corresponding electronic means (e.g., in the backplane 130 in FIG. 1A) that includes multiple driver circuits configured to drive the light emitting elements 125 in the picture element 230. In some examples, one or more common driver circuits can be used for each of the sub-picture elements 620. In the example in FIG. 8B, the electronic means can include multiple unit cells configured to control the operation of individual sub-picture elements and/or light emitting elements that are part of a sub-picture element.

What follows below are descriptions of various examples of architectures for picture elements (e.g., the picture element 320) that can provide a full set of light field views or a partial set of light field views from a display such as a light field display. A light field display that provides a partial set of light field views can be referred to as a partial light field display, for example. In this regard, the features described above in connection with different light field displays can apply as appropriate to a partial light field display, including having similar physical characteristics and structural units (e.g., picture elements or super-raxels, light emitting elements or sub-raxels, light detecting elements, groups of light emitting elements or raxels, light steering optical elements). In this disclosure, the terms "light field views" and "views" can be used interchangeably.

Figure 9A:
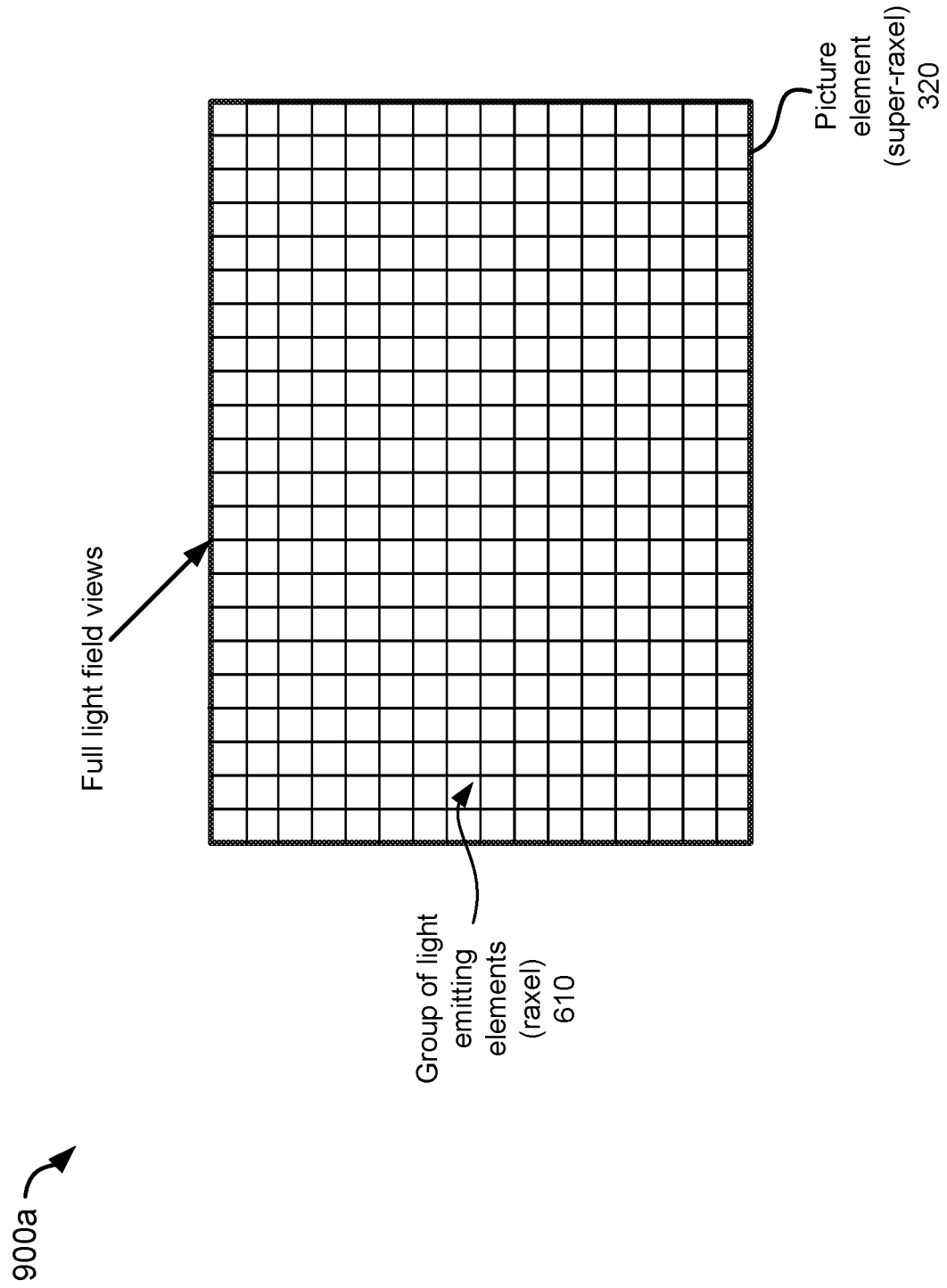
FIG. 9A illustrates an example of a light field display picture element with full light field views, in accordance with aspects of this disclosure.

A diagram 900a in FIG. 9A shows an example of a picture element 320 configured to provide or contribute to a full set of light field views. In this example, the entire area of the picture element 320 is covered with an array or grid of groups of light emitting elements 610 (or raxels 610), where each of these groups provides or contributes to a different light field view. When multiple picture elements 320 in FIG. 9A are used to construct a light field display, the light field display can provide a full set of light field views based on the contributions from the raxels 610 in the picture elements 320.

Figure 9B:
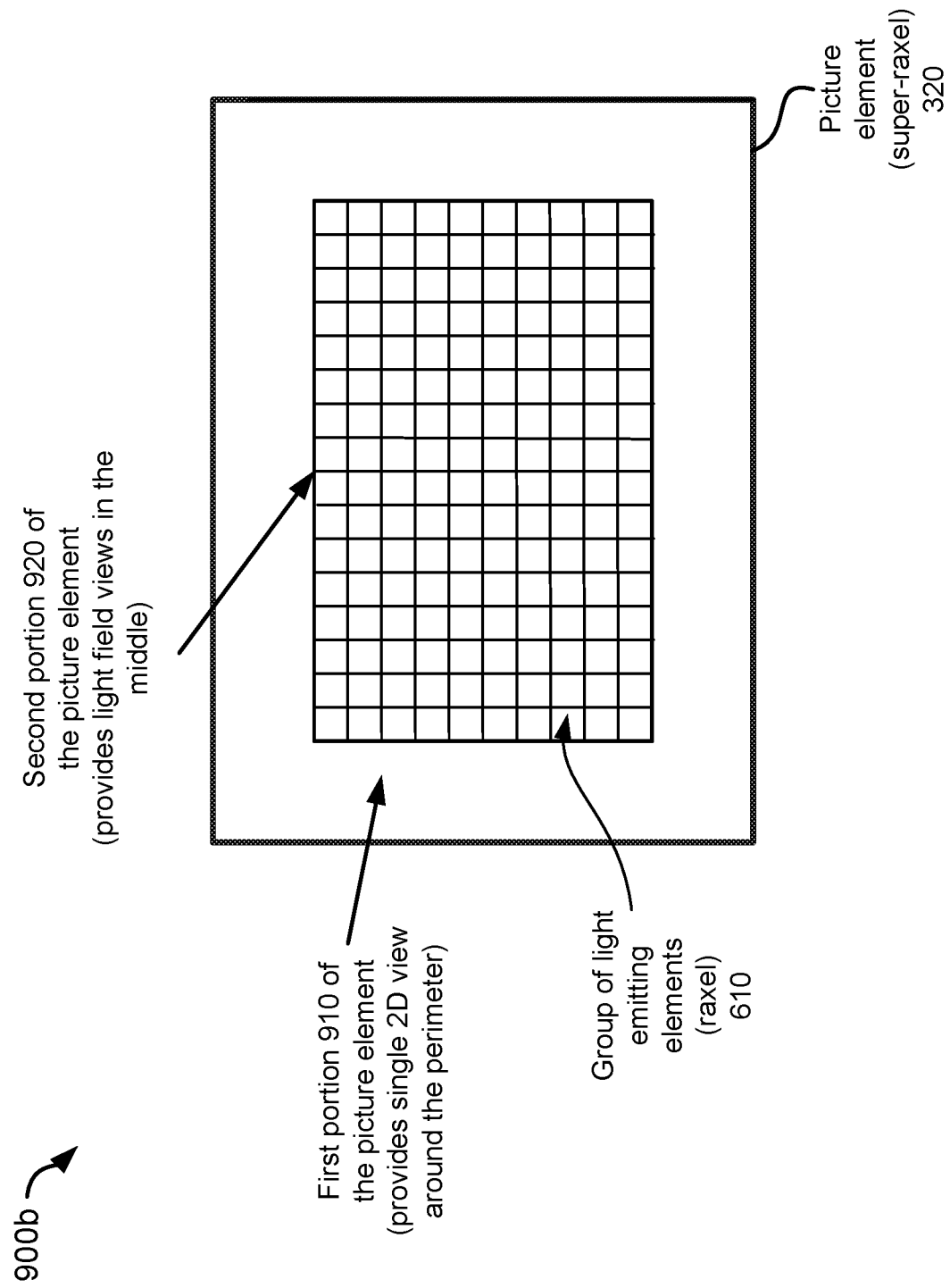
FIG. 9B illustrates an example of a light field display picture element with light field views in the middle, in accordance with aspects of this disclosure.

In FIG. 9B, a diagram 900b shows an example of a picture element 320 configured to provide or contribute to light field views in the middle. In this example, a first or outer portion or region 910 of the picture element 320 provides a single two dimensional (2D) view around the perimeter of the picture element 320. A second or inner portion or region 920 of the picture element 320, which is surrounded by the first portion 910 and is placed or positioned about the middle of the picture element 320, is configured to provide light field views in this portion of the picture element 320. In one implementation, being placed or positioned about the middle can refer to the second portion 920 being offset (e.g., laterally offset, vertically offset, or a combination) from a center or middle of the picture element 320. The second portion 920 includes an array or grid of groups of light emitting elements 610 (or raxels 610), where each of these groups provides or contributes to a different light field view. When multiple picture elements 320 in FIG. 9B are used to construct a light field display, the light field display can provide a 2D view in the perimeter and light field views in the middle based on the contributions from the raxels 610 in the picture elements 320. In some implementations, however, the first portion 910 can be used to provide more than one (at least one) 2D view. That is, there could be different 2D views (or light outputs that contribute to different 2D views) provided throughout the first portion 910. For example, a different 2D view can be provided on a right side of the first portion 910 than one a left side of the first portion 910. In another example, a different 2D view can be provided in a center or middle of the first portion 910 than on either or both of the right side or the left side of the first portion 910. Similarly for the various other configurations described below.

Figure 9C:
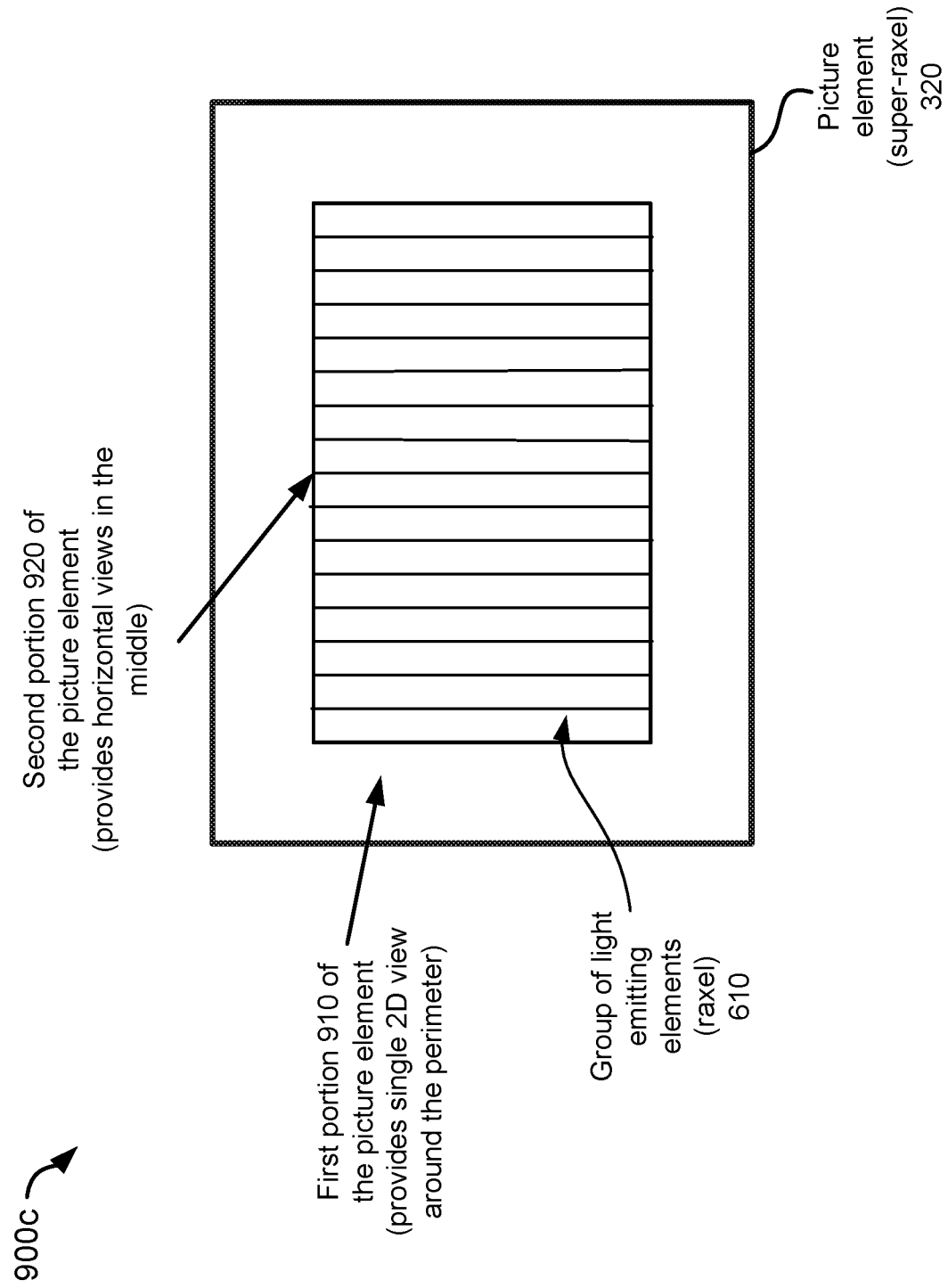
FIG. 9C illustrates an example of a light field display picture element with horizontal views in the middle, in accordance with aspects of this disclosure.

In FIG. 9C, a diagram 900c shows an example of a picture element 320 configured to provide or contribute to horizontal light field views in the middle. In this example, a first or outer portion or region 910 of the picture element 320 provides a single 2D view around the perimeter of the picture element 320. A second or inner portion or region 920 of the picture element 320, which is surrounded by the first portion 910 and is placed or positioned about the middle of the picture element 320, is configured to provide horizontal light field views in this portion of the picture element 320. In one implementation, being placed or positioned about the middle can refer to the second portion 920 being offset (e.g., laterally offset, vertically offset, or a combination) from a center or middle of the picture element 320. The second portion 920 includes an array or grid of groups of light emitting elements 610 (or raxels 610), where each of these groups provides or contributes to a different horizontal light field view. As illustrated, the groups or raxels 610 in FIG. 9C are different from those in FIG. 9B because the configuration of the raxels 610 in FIG. 9C supports horizontal views only as opposed to support for both horizontal and vertical views as done by the configuration of the raxels 610 in FIG. 9B. When multiple picture elements 320 in FIG. 9C are used to construct a light field display, the light field display can provide at least a 2D view in the perimeter and horizontal light field views in the middle based on the contributions from the raxels 610 in the picture elements 320. Moreover, similar to FIG. 9C, more than one 2D view can be produced, with contributions to different 2D views being produced by different areas or regions of the first portion 910.

Figure 9D:
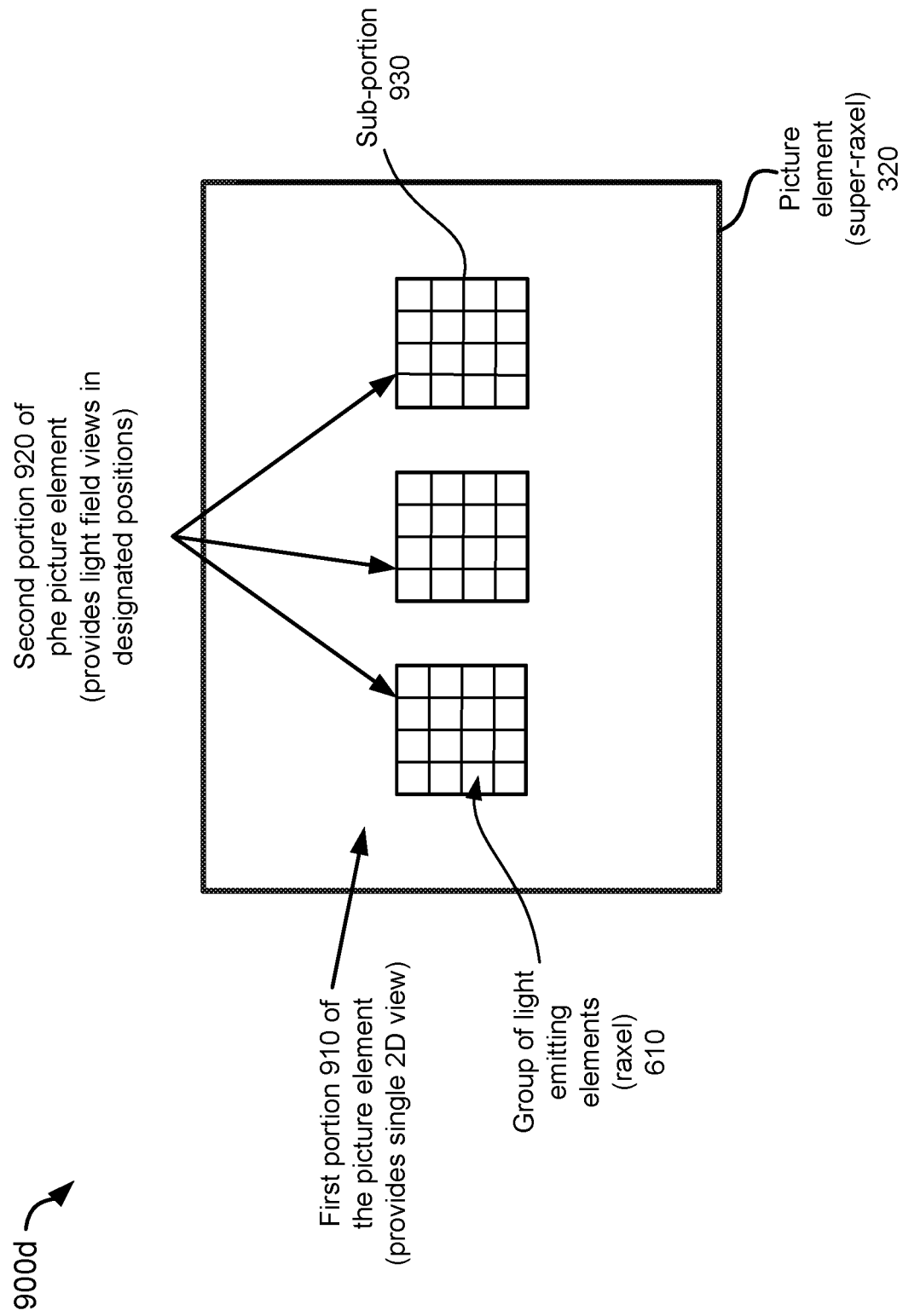
FIG. 9D illustrates an example of a light field display picture element with light field views in designated locations, in accordance with aspects of this disclosure.

In FIG. 9D, a diagram 900d shows an example of a picture element 320 configured to provide or contribute to light field views in designated locations or positions. In this example, a first or outer portion or region 910 of the picture element 320 provides a single 2D view generally around the perimeter of the picture element 320. A second or inner portion or region 920 of the picture element 320, which is surrounded by the first portion 910, is configured to provide light field views in designated or predetermined locations or positions of the picture element 320. For example, the second portion 920 can include multiple, separate sub-portions 930, each of which is in a different location or position of the picture element 320. Although the example shown in FIG. 9D has three sub-portions 930 horizontally aligned, this disclosure need not be so limited. That is, the number of sub-portions 930 can be less or greater than the number shown in FIG. 9D. Moreover, the sub-portions 930 can be aligned in different ways (e.g., horizontally aligned, vertically aligned, or a combination), or need not be aligned at all.

Each of the sub-portions 930 of the second portion 920 includes an array or grid of groups of light emitting elements 610 (or raxels 610), where each of these groups provides or contributes to a different light field view. When multiple picture elements 320 in FIG. 9D are used to construct a light field display, the light field display can provide a 2D view in the perimeter and light field views in the designated positions based on the contributions from the raxels 610 that are located in the various sub-portions 930 in the picture elements 320.

Figure 9E:
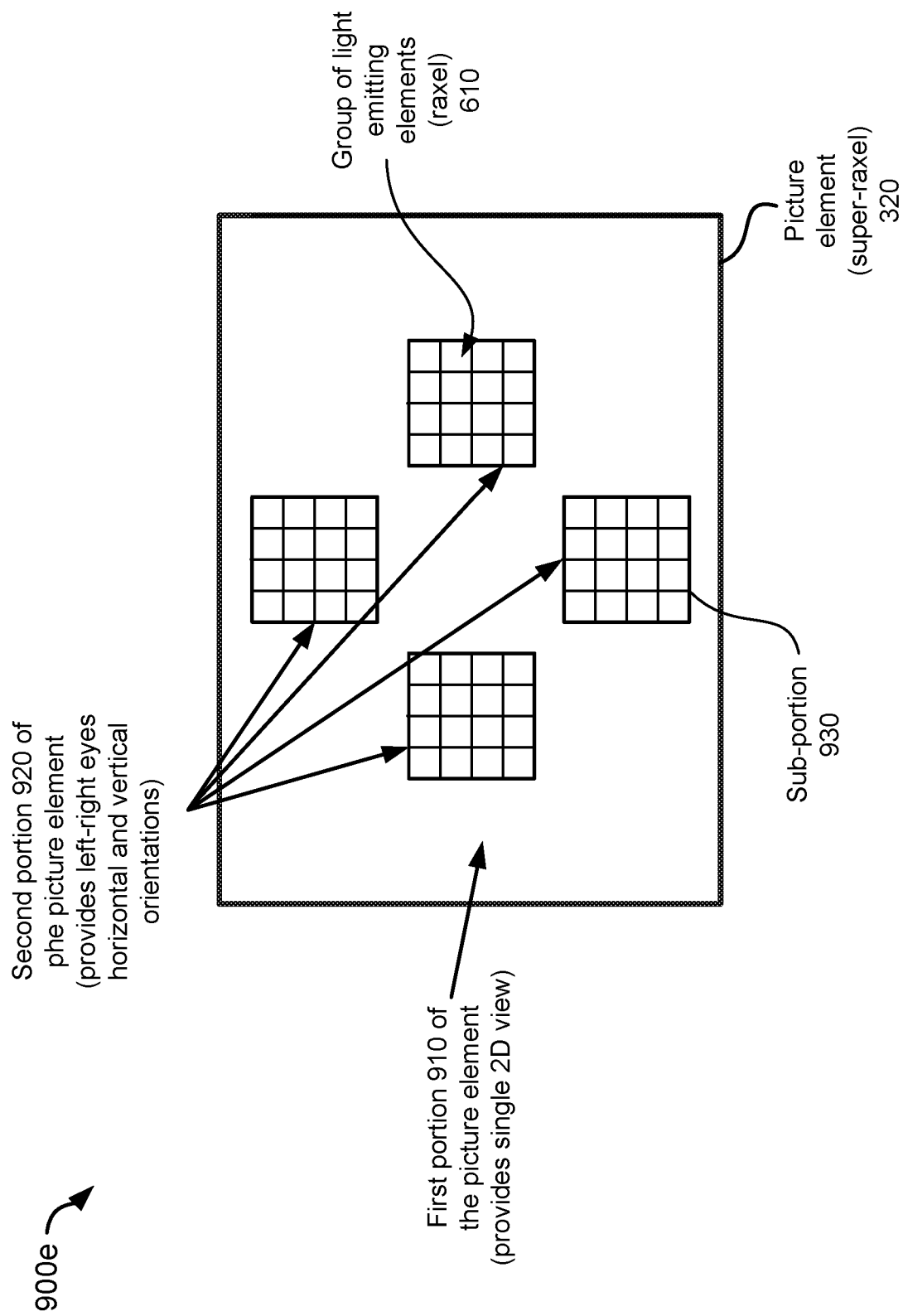
FIG. 9E illustrates an example of a light field display picture element with two left-right eye orientations, in accordance with aspects of this disclosure.

In FIG. 9E, a diagram 900e shows another example of the picture element 320 in FIG. 9D, where the picture element 320 is configured to provide or contribute to light field views in designated locations or positions that enable support for two left-right eye orientations. In this example, there are four (4) sub-portion 930, two of which are vertically aligned about the center or middle of the picture element 320 to provide a left-right eye vertical or portrait orientation, and another two are horizontally aligned about the center or middle of the picture element 320 to provide a left-right eye horizontal or landscape orientation. When multiple picture elements 320 in FIG. 9E are used to construct a light field display, the light field display can provide a 2D view in the perimeter and light field views in the designated positions based on the contributions from the raxels 610 that are located in the various sub-portions 930 in the picture elements 320, where the light field views provided support vertical and horizontal left-right eye orientations.

Figure 9F:
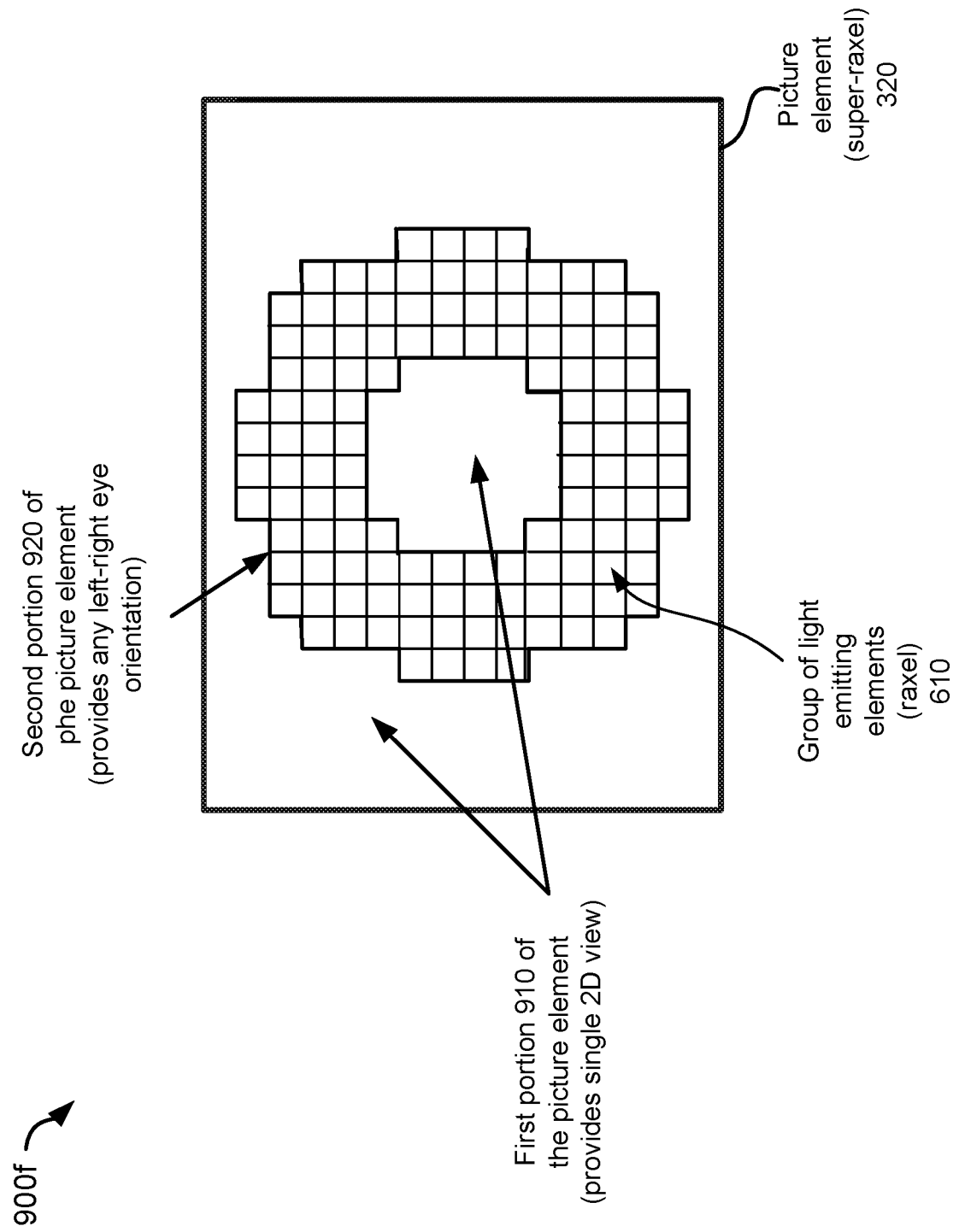
FIG. 9F illustrates an example of a light field display picture element with continuous left-right eye orientations, in accordance with aspects of this disclosure.

In FIG. 9F, a diagram 900f shows an example of a picture element 320 configured to provide or contribute light field views to support any left-right eye orientation. In this example, a first or outer portion 910 of the picture element 320 provides a single 2D view around the perimeter of the picture element 320. A second or inner portion 920 of the picture element 320, which has a disk-shape and is surrounded by the first portion 910, is placed or positioned about the middle of the picture element 320, and is configured to provide light field views that support any left-right eye orientation. In one implementation, being placed or positioned about the middle can refer to the second portion 920 being offset (e.g., laterally offset, vertically offset, or a combination) from a center or middle of the picture element 320. The inside of the disk-shaped second potion 920 can be considered to be part of the first portion 910 and can therefore provide a 2D view in the middle of the picture element 320. The second portion 920 includes an arrangement of groups of light emitting elements 610 (or raxels 610), where each of these groups provides or contributes to a different horizontal light field view. When multiple picture elements 320 in FIG. 9F are used to construct a light field display, the light field display can provide a 2D view in the perimeter and in the middle/center, and light field views in a disk-shaped portion about the middle/center based on the contributions from the raxels 610 in the picture elements 320.

Each of the configurations described above in connection with FIGS. 9A-9F can be implemented using the array of light emitting elements in a picture element as shown in the diagram 800a in FIG. 8A, or using a picture element with sub-picture elements as shown in the diagram 800b in FIG. 8B. That is, the light emitting elements 125 and/or the groups or raxels 610 of light emitting elements 125 can be arranged, organized, and controlled (e.g., addressed) as described in FIG. 8A or as described in FIG. 8B.

In one example associated with the arrangement shown in FIG. 8A, for the portion of the picture element 320 that is used to provide at least one 2D view, there are light emitting elements that produce red light, light emitting elements that produce green light, and light emitting elements that produce blue light, where each of the light emitting elements and/or each group of light emitting elements in this portion can be individually controlled by respective circuits in the electronic means. For the portion of the picture element 320 that is used to provide at least one 3D view, there are also light emitting elements that produce red light, light emitting elements that produce green light, and light emitting elements that produce blue light, where each of the light emitting elements and/or each group of light emitting elements in this portion can be individually controlled by respective circuits in the electronic means.

In another example associated with the arrangement shown in FIG. 8B, for the portion of the picture element 320 that issued to provide at least one 2D view, there are light emitting elements that produce red light, light emitting elements that produce green light, and light emitting elements that produce blue light, where the light emitting elements that produce light of the same color (or a subset thereof) can be controlled by respective circuits in the electronic means. In one implementation, the light emitting elements of a particular color (or a subset thereof) in this portion can effectively operate as a single light emitting element. For the portion of the picture element 320 that is used to provide at least one 3D view, there are also light emitting elements that produce red light, light emitting elements that produce green light, and light emitting elements that produce blue light, where the light emitting elements that produce light of the same color (or a subset thereof) can be controlled by respective circuits in the electronic means.

In yet another aspect, the picture elements 320 described in connection with various configurations as described in FIGS. 9A-9F can be configured to have certain portions or regions produce light outputs that contribute to providing one or more 2D views to a viewer away from the light field display. In this regard, the picture elements 320 can be further configured to control the light output properties (e.g., illumination levels) of the appropriate light emitting elements 125 and/or groups of light emitting elements (e.g., raxels 610) for dimming or turning off the 2D views to, for example, de-emphasize the 2D views relative to 3D views and/or to save power.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A light field display, comprising:
multiple picture elements, each one of the multiple picture elements including a plurality of light emitting elements and having:
  a first array of immediately adjacent light emitting elements, of the plurality of light emitting elements, configured to produce a first light output contributing to at least one two-dimensional (2D) view, and
  a second array of immediately adjacent light emitting elements, of the plurality of light emitting elements, configured to produce a second light output including at least two different colors and contributing to at least one three-dimensional (3D) view; and
  a respective light-steering optical element configured to change propagation direction of the first light output and the second light output upon propagation through the light-steering optical element;
a backplane including electronic circuits electronically connected with the multiple picture elements and configured to drive the first array of contiguous light emitting elements and the second array of contiguous light emitting elements in each one of the multiple picture elements for generating the at least one 2D view and the at least one 3D view; and
a picture element configuration controller communicatively coupled to the backplane and including a processor and a memory storing instructions that, when executed by the processor, control the processor to: (i) dynamically identify the first array and the second array; and (ii) select and configure each of the plurality of light emitting elements to be part of one of the first and second arrays accordingly.

2. The light field display of claim 1, wherein:
the second array of contiguous light emitting elements forms an inner portion of each one of the multiple picture elements, and
the first array of contiguous light emitting elements forms an outer portion of the picture element that surrounds the inner portion.

3. The light field display of claim 1, further comprising a third array of contiguous light emitting elements configured to produce a third light output that contributes to at least a second 3D view, and wherein
the first array of contiguous light emitting elements surrounds the second and third arrays of contiguous light emitting elements.

4. The light field display of claim 3, wherein the second and third arrays of contiguous light emitting elements are configured to produce light outputs at designated positions in the light field display.

5. The light field display of claim 1, wherein each one of the light emitting elements of first and second arrays of contiguous light emitting elements is an inorganic light emitting diode (LED).

6. The light field display of claim 1, wherein the light emitting elements in the second array of contiguous light emitting elements include a first set of light emitting diodes (LEDs) that produce red light, a second set of LEDs that produce green light, and a third set of LEDs that produce blue light.

7. The light field display of claim 1, wherein the backplane electronic means includes multiple driver circuits, the multiple driver circuits being configured to individually drive each one of the light emitting elements in the first and second arrays of light emitting elements and in the second set of light emitting elements.

8. The light field display of claim 1, wherein each of the first and second arrays of contiguous light emitting elements are respectively identified from one of a plurality of configurations programmed into the picture element configuration controller.

9. The light field display of claim 1, the light steering element including a diffraction grating.

10. The light field display of claim 1, the backplane being configured to drive the first array of contiguous light emitting elements and the second array of contiguous light emitting elements in each one of the multiple picture elements for simultaneously generating the at least one 2D view and the at least one 3D view.

11. A display device for producing a plurality of light field views, the display device comprising:
a first substrate supporting a plurality of picture elements thereon,
at least one of the plurality of picture elements including a plurality of light emitting elements and:
a first array of immediately adjacent light emitting elements, of the plurality of light emitting elements, configured to (i) contribute to a first portion of a two dimensional (2D) view and (ii) produce a plurality of first ray elements, and
a second array of immediately adjacent light emitting elements, of the plurality of light emitting elements, configured to (i) produce at least two different colors, (ii) contribute to at least a first portion of a light field view, and (ii) produce a plurality of second ray elements,
a light-steering optical element optically coupled with at least one of the plurality of picture elements, and configured to steer at least one of the first ray elements and at least one of the second ray elements to contribute to at least one of the plurality of light field views;
a second substrate supporting a plurality of drivers thereon, each one of the plurality of drivers being in electronic communication with at least one of the plurality of picture elements, at least one of the plurality of drivers being configured for controlling the first and second arrays in producing the 2D view and the at least one light field view, respectively and
a picture element configuration controller communicatively coupled to the plurality of drivers and including a processor and a memory storing instructions that, when executed by the processor, control the processor to: (i) dynamically identify the first array and the second array; and (ii) select and configure each of the plurality of light emitting elements to be part of one of the first and second arrays accordingly.

12. The display device of claim 11, wherein the first array surrounds the second array.

13. The display device of claim 11, wherein the at least one of the plurality of picture elements further includes a third portion including a third contiguous set of light emitting elements, the third portion being configured for producing at least a second portion of the 2D view.

14. The display device of claim 11, wherein the at least one of the plurality of picture elements further includes a third portion including a third contiguous set of light emitting elements, the third portion being configured for producing at least a second portion of the light field view.

15. The display device of claim 11, the at least one of the plurality of drivers being configured to control the first and second arrays in simultaneously producing the 2D view and the at least one light field view, respectively.

16. The light field display of claim 11, the light steering element including a diffraction grating.

* * * * *

UNITED STATES PATENT AND TRADEMARK OFFICE
CERTIFICATE OF CORRECTION

PATENT NO. : 10,999,573 B2
APPLICATION NO. : 16/391987
DATED : May 4, 2021
INVENTOR(S) : Gang He et al.

It is certified that error appears in the above-identified patent and that said Letters Patent is hereby corrected as shown below:

In the Claims

Claim 1 at Column 18 Line 37–38 "contiguous light emitting elements and the second array of contiguous light emitting elements" should read -- immediately adjacent light emitting elements and the second array of immediately adjacent light emitting elements --

Claim 2 at Column 18 Line 51 "contiguous light emitting elements" should read -- immediately adjacent light emitting elements --

Claim 2 at Column 18 Line 54 "contiguous light emitting elements" should read -- immediately adjacent light emitting elements --

Claim 3 at Column 18 Line 58 "contiguous light emitting elements" should read -- immediately adjacent light emitting elements --

Claim 3 at Column 18 Lines 61–62 "contiguous light emitting elements surrounds the second and third arrays of contiguous light emitting elements" should read -- immediately adjacent light emitting elements surrounds the second and third arrays of immediately adjacent light emitting elements --

Claim 4 at Column 18 Line 65 "contiguous light emitting elements" should read -- immediately adjacent light emitting elements --

Claim 5 at Column 19 Line 3 "contiguous light emitting elements" should read -- immediately adjacent light emitting elements --

Claim 6 at Column 19 Line 6 "contiguous light emitting elements" should read -- immediately adjacent light emitting elements --

Claim 8 at Column 19 Line 18 "contiguous light emitting elements" should read -- immediately adjacent light emitting elements --

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*

Claim 10 at Column 19 Lines 25–26 "contiguous light emitting elements and the second array of contiguous light emitting elements" should read -- immediately adjacent light emitting elements and the second array of immediately adjacent light emitting elements --

Claim 13 at Column 20 Line 28 "contiguous set of light emitting elements" should read -- immediately adjacent set of light emitting elements --

Claim 14 at Column 20 Line 34 "contiguous set of light emitting elements" should read -- immediately adjacent set of light emitting elements --